(12) United States Patent
Kondiles et al.

(10) Patent No.: US 12,130,813 B2
(45) Date of Patent: *Oct. 29, 2024

(54) ALLOCATION OF MAIN MEMORY FOR DATABASE OPERATIONS IN A COMPUTING SYSTEM

(71) Applicant: Ocient Holdings LLC, Chicago, IL (US)

(72) Inventors: George Kondiles, Chicago, IL (US); Jason Arnold, Chicago, IL (US)

(73) Assignee: Ocient Holdings LLC, Chicago, IL (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/534,912

(22) Filed: Dec. 11, 2023

(65) Prior Publication Data

US 2024/0104098 A1 Mar. 28, 2024

Related U.S. Application Data

(63) Continuation of application No. 18/177,963, filed on Mar. 3, 2023, now Pat. No. 11,907,219, which is a (Continued)

(51) Int. Cl.
*G06F 16/00* (2019.01)
*G06F 3/06* (2006.01)
(Continued)

(52) U.S. Cl.
CPC ...... *G06F 16/24542* (2019.01); *G06F 3/0604* (2013.01); *G06F 3/0647* (2013.01); (Continued)

(58) Field of Classification Search
CPC ............ G06F 16/24542; G06F 3/0604; G06F 3/0647; G06F 3/068; G06F 7/24; (Continued)

(56) References Cited

U.S. PATENT DOCUMENTS 5,548,770 A 8/1996 Bridges
5,983,274 A 11/1999 Hyder
(Continued)

OTHER PUBLICATIONS

A new high performance fabric for HPC, Michael Feldman, May 2016, Intersect360 Research.
(Continued)

*Primary Examiner* — Tyler J Torgrimson
(74) *Attorney, Agent, or Firm* — Garlick & Markison; Bruce E. Stuckman; Katherine C. Stuckman

(57) ABSTRACT

A node of a computing system includes a main memory and a plurality of processing core resources. The main memory includes a computing device section and a database section. The computing device section includes a computing device operating system area and a computing device general area. The database section includes a database section that includes a database operating system area, a disk area, a network area, and a database general area. The database operating system area allocates at least one portion of the main memory for database operations that is locked from access by the computing device operating system area.

20 Claims, 21 Drawing Sheets

Related U.S. Application Data continuation of application No. 17/646,885, filed on Jan. 4, 2022, now Pat. No. 11,921,718, which is a continuation of application No. 16/267,201, filed on Feb. 4, 2019, now Pat. No. 11,249,998.

(60) Provisional application No. 62/745,787, filed on Oct. 15, 2018.

(51) Int. Cl.

| | | |
|---|---|---|
| *G06F 7/24* | (2006.01) | |
| *G06F 9/4401* | (2018.01) | |
| *G06F 9/50* | (2006.01) | |
| *G06F 11/10* | (2006.01) | |
| *G06F 12/0893* | (2016.01) | |
| *G06F 12/109* | (2016.01) | |
| *G06F 16/17* | (2019.01) | |
| *G06F 16/22* | (2019.01) | |
| *G06F 16/23* | (2019.01) | |
| *G06F 16/242* | (2019.01) | |
| *G06F 16/2453* | (2019.01) | |
| *G06F 16/2455* | (2019.01) | |
| *G06F 16/2457* | (2019.01) | |
| *G06F 16/2458* | (2019.01) | |
| *G06F 16/27* | (2019.01) | |
| *G06F 16/901* | (2019.01) | |
| *H03M 7/30* | (2006.01) | |
| *H04L 67/10* | (2022.01) | |

(52) U.S. Cl.
CPC ............... *G06F 3/068* (2013.01); *G06F 7/24* (2013.01); *G06F 9/4406* (2013.01); *G06F 9/5016* (2013.01); *G06F 9/5027* (2013.01); *G06F 9/5061* (2013.01); *G06F 11/1004* (2013.01); *G06F 11/1044* (2013.01); *G06F 11/1076* (2013.01); *G06F 12/0893* (2013.01); *G06F 12/109* (2013.01); *G06F 16/1727* (2019.01); *G06F 16/22* (2019.01); *G06F 16/2246* (2019.01); *G06F 16/2282* (2019.01); *G06F 16/2365* (2019.01); *G06F 16/244* (2019.01); *G06F 16/2445* (2019.01); *G06F 16/2453* (2019.01); *G06F 16/24553* (2019.01); *G06F 16/24573* (2019.01); *G06F 16/2458* (2019.01); *G06F 16/278* (2019.01); *G06F 16/901* (2019.01); *G06F 16/9017* (2019.01); *H03M 7/30* (2013.01); *H04L 67/10* (2013.01); *G06F 3/067* (2013.01); *G06F 16/24547* (2019.01); *G06F 2211/1011* (2013.01); *G06F 2212/608* (2013.01)

(58) Field of Classification Search
CPC .... G06F 9/4406; G06F 9/5016; G06F 9/5027; G06F 9/5061; G06F 11/1004; G06F 11/1044; G06F 11/1076; G06F 12/0893; G06F 12/109; G06F 16/1727; G06F 16/22; G06F 16/2246; G06F 16/2282; G06F 16/2365; G06F 16/244; G06F 16/2445; G06F 16/2453; G06F 16/24553; G06F 16/24573; G06F 16/2458; G06F 16/278; G06F 16/901; G06F 16/9017; G06F 3/067; G06F 16/24547; G06F 2211/1011; G06F 2212/608; H03M 7/30; H03M 7/3064; H03M 7/6023; H04L 67/10; H04L 67/1097; H04L 67/561
See application file for complete search history.

(56) References Cited

U.S. PATENT DOCUMENTS

| | | |
|---|---|---|
| 6,230,200 B1 | 5/2001 | Forecast |
| 6,633,772 B2 | 10/2003 | Ford |
| 7,499,907 B2 | 3/2009 | Brown |
| 7,908,242 B1 | 3/2011 | Achanta |
| 7,984,043 B1 | 7/2011 | Waas |
| 9,317,554 B2 | 4/2016 | Shankar |
| 2001/0051949 A1 | 12/2001 | Carey |
| 2002/0032676 A1 | 3/2002 | Reiner |
| 2004/0162853 A1 | 8/2004 | Brodersen |
| 2005/0065911 A1* | 3/2005 | Ellis ............... G06F 16/24542 |
| 2008/0133456 A1 | 6/2008 | Richards |
| 2009/0018996 A1 | 1/2009 | Hunt |
| 2009/0063893 A1 | 3/2009 | Bagepalli |
| 2009/0183167 A1 | 7/2009 | Kupferschmidt |
| 2010/0082577 A1 | 4/2010 | Mirchandani |
| 2010/0241646 A1 | 9/2010 | Friedman |
| 2010/0274983 A1 | 10/2010 | Murphy |
| 2010/0312756 A1 | 12/2010 | Zhang |
| 2010/0328115 A1 | 12/2010 | Binnig |
| 2011/0219169 A1 | 9/2011 | Zhang |
| 2012/0109888 A1 | 5/2012 | Zhang |
| 2012/0151118 A1 | 6/2012 | Flynn |
| 2012/0185866 A1 | 7/2012 | Couvee |
| 2012/0254252 A1 | 10/2012 | Jin |
| 2012/0311246 A1 | 12/2012 | McWilliams |
| 2013/0332484 A1 | 12/2013 | Gajic |
| 2014/0006843 A1 | 1/2014 | Kim |
| 2014/0047095 A1 | 2/2014 | Breternitz |
| 2014/0136510 A1 | 5/2014 | Parkkinen |
| 2014/0188841 A1 | 7/2014 | Sun |
| 2014/0208331 A1* | 7/2014 | Li ..................... G06F 9/5033 |
| | | 718/105 |
| 2015/0067410 A1 | 3/2015 | Kumar |
| 2015/0130825 A1 | 5/2015 | Liao |
| 2015/0172115 A1 | 6/2015 | Nguyen |
| 2015/0200818 A1 | 7/2015 | Winkelstrater |
| 2015/0205607 A1 | 7/2015 | Lindholm |
| 2015/0244804 A1 | 8/2015 | Warfield |
| 2015/0248366 A1 | 9/2015 | Bergsten |
| 2015/0293966 A1 | 10/2015 | Cai |
| 2015/0310045 A1 | 10/2015 | Konik |
| 2015/0324236 A1 | 11/2015 | Gopalan |
| 2016/0004450 A1* | 1/2016 | Lakshman ............ G06F 3/0664 |
| | | 711/162 |
| 2016/0034547 A1 | 2/2016 | Lerios |
| 2016/0070754 A1 | 3/2016 | Mokbel |
| 2017/0034253 A1 | 2/2017 | Jiang |
| 2017/0192964 A1 | 7/2017 | Park |
| 2018/0067975 A1 | 3/2018 | Kato |
| 2018/0232255 A1* | 8/2018 | Nordin ................... H04L 43/10 |
| 2018/0232320 A1 | 8/2018 | Raval |

OTHER PUBLICATIONS

Alechina, N. (2006-2007). B-Trees. School of Computer Science, University of Nottingham, http://www.cs.nott.ac.uk/~psznza/G5BADS06/lecture13-print.pdf. 41 pages.

Amazon DynamoDB: ten things you really should know, Nov. 13, 2015, Chandan Patra, http://cloudacademy. .com/blog/amazon-dynamodb-ten-thing.

An Inside Look at Google BigQuery, by Kazunori Sato, Solutions Architect, Cloud Solutions team, Google Inc., 2012.

Big Table, a NoSQL massively parallel table, Paul Krzyzanowski, Nov. 2011, https://www.cs.rutgers.edu/pxk/417/notes/contentlbigtable.html.

Distributed Systems, Fall2012, Mohsen Taheriyan, http://www-scf.usc.edu/-csci57212011Spring/presentations/Taheriyan.pptx.

International Searching Authority; International Search Report and Written Opinion; International Application No. PCT/US2017/054773; Feb. 13, 2018; 17 pgs.

International Searching Authority; International Search Report and Written Opinion; International Application No. PCT/US2017/054784; Dec. 28, 2017; 10 pgs.

(56) References Cited

OTHER PUBLICATIONS

International Searching Authority; International Search Report and Written Opinion; International Application No. PCT/US2017/066145; Mar. 5, 2018; 13 pgs.
International Searching Authority; International Search Report and Written Opinion; International Application No. PCT/US2017/066169; Mar. 6, 2018; 15 pgs.
International Searching Authority; International Search Report and Written Opinion; International Application No. PCT/US2018/025729; Jun. 27, 2018; 9 pgs.
International Searching Authority; International Search Report and Written Opinion; International Application No. PCT/US2018/034859; Oct. 30, 2018; 8 pgs.
MapReduce: Simplified Data Processing on Large Clusters, OSDI 2004, Jeffrey Dean and Sanjay Ghemawat, Google, Inc., 13 pgs.
Rodero-Merino, L.; Storage of Structured Data: Big Table and HBase, New Trends in Distributed Systems, MSc Software and Systems, Distributed Systems Laboratory; Oct. 17, 2012; 24 pages.
StackOverflow, Why is there an OS segment reserved in virtual memory, Website, Year:2016_retrieved Jun. 6, 2023.
Step 2: Examine the data model and implementation details, 2016, Amazon Web Services, Inc., http://docs.aws.amazon.com/amazondynamodb/latestldeveloperguide!Ti . . . .

\* cited by examiner database system 10 computing device 18 computing device 18 computing device 18 node 37 node 37 node 37 data set

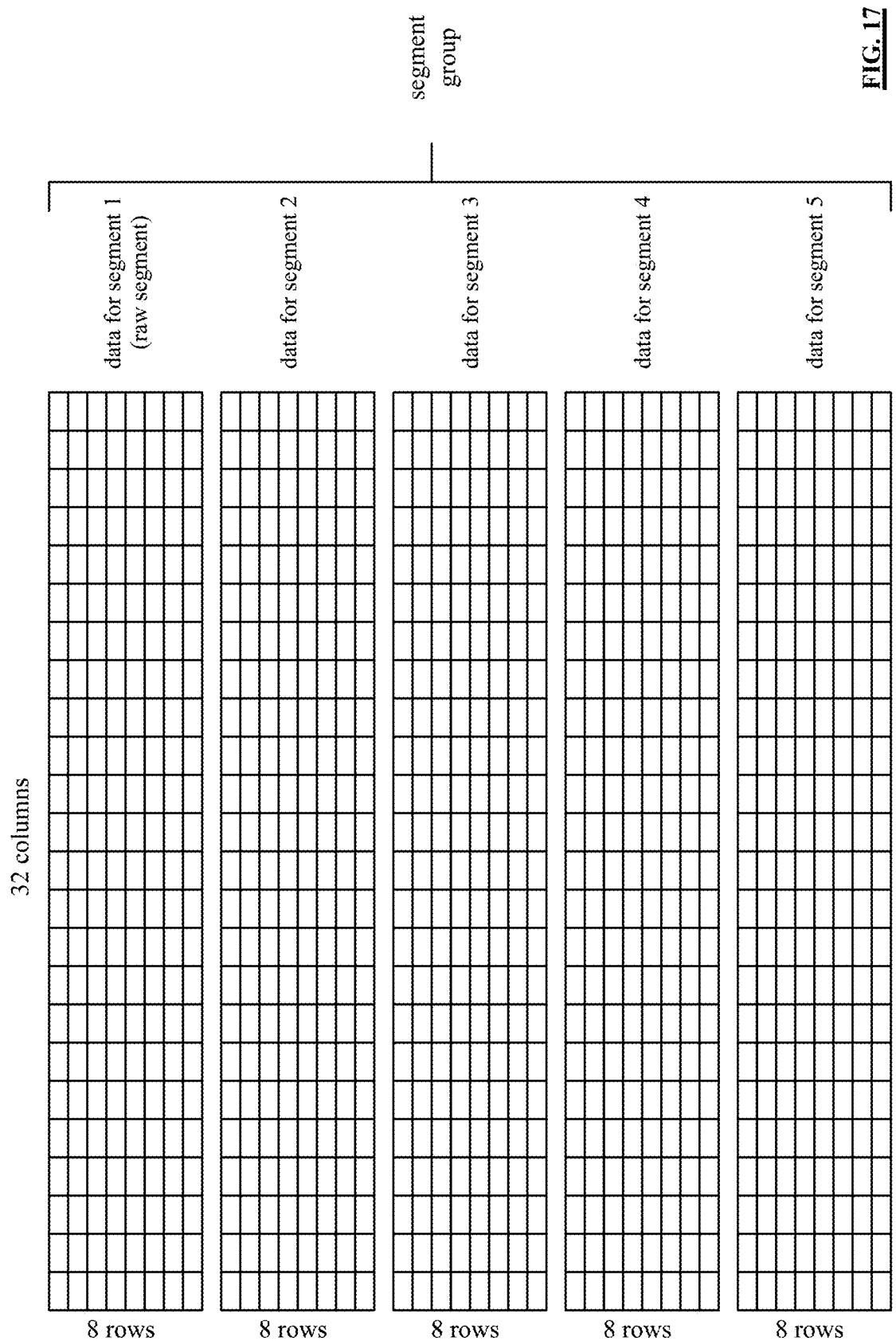

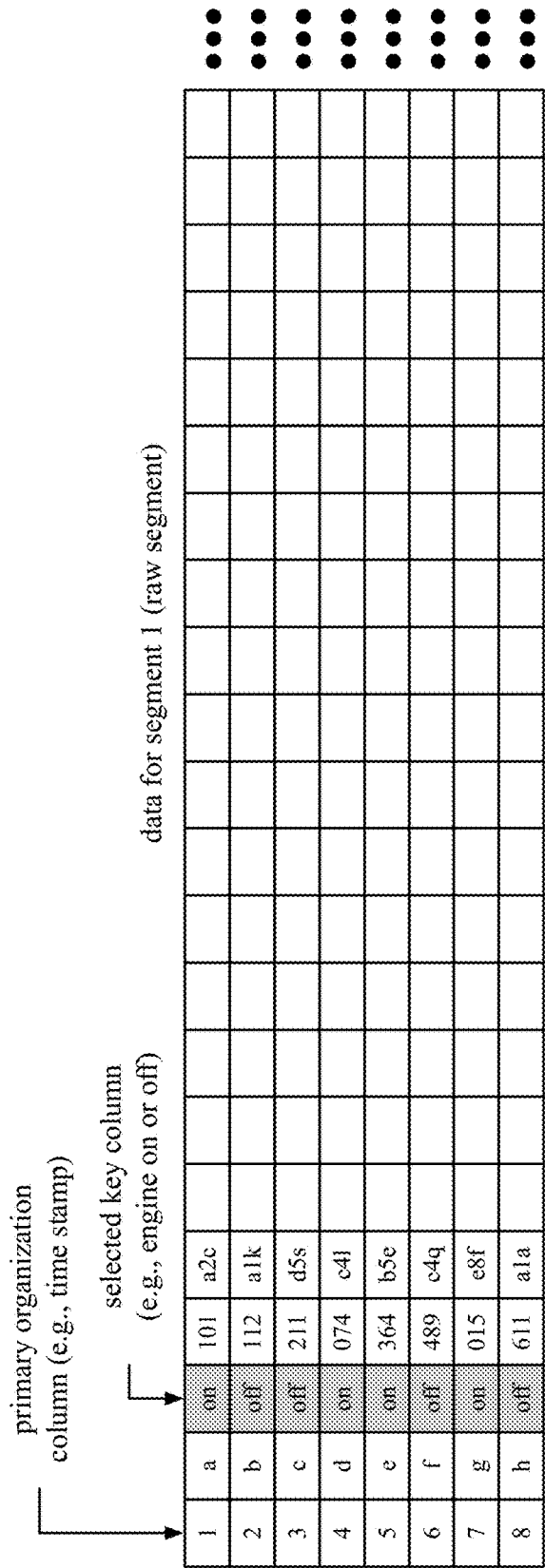

FIG. 21

ALLOCATION OF MAIN MEMORY FOR DATABASE OPERATIONS IN A COMPUTING SYSTEM

CROSS-REFERENCE TO RELATED APPLICATIONS

The present U.S. Utility Patent application claims priority pursuant to 35 U.S.C. § 120 as a continuation of U.S. Utility application Ser. No. 18/177,963, entitled "QUERY EXECUTION VIA NODES WITH PARALLELIZED RESOURCES", filed Mar. 3, 2023, which is a continuation of U.S. Utility application Ser. No. 17/646,885, entitled "QUERY EXECUTION VIA COMPUTING DEVICES WITH PARALLELIZED RESOURCES", filed Jan. 4, 2022, which is a continuation of U.S. Utility application Ser. No. 16/267,201, entitled "LARGE SCALE APPLICATION SPECIFIC COMPUTING SYSTEM ARCHITECTURE AND OPERATION," filed Feb. 4, 2019, issued as U.S. Pat. No. 11,249,998 on Feb. 15, 2022, which claims priority pursuant to 35 U.S.C. § 119(e) to U.S. Provisional Application No. 62/745,787, entitled "DATABASE SYSTEM AND OPERATION," filed Oct. 15, 2018, all of which are hereby incorporated herein by reference in their entirety and made part of the present U.S. Utility Patent Application for all purposes.

STATEMENT REGARDING FEDERALLY SPONSORED RESEARCH OR DEVELOPMENT

Not Applicable.

INCORPORATION-BY-REFERENCE OF MATERIAL SUBMITTED ON A COMPACT DISC

Not Applicable.

BACKGROUND OF THE INVENTION

Technical Field of the Invention

This invention relates generally to computer networking and more particularly to database system and operation.

Description of Related Art

Computing devices are known to communicate data, process data, and/or store data. Such computing devices range from wireless smart phones, laptops, tablets, personal computers (PC), work stations, and video game devices, to data centers that support millions of web searches, stock trades, or on-line purchases every day. In general, a computing device includes a central processing unit (CPU), a memory system, user input/output interfaces, peripheral device interfaces, and an interconnecting bus structure.

As is further known, a computer may effectively extend its CPU by using "cloud computing" to perform one or more computing functions (e.g., a service, an application, an algorithm, an arithmetic logic function, etc.) on behalf of the computer. Further, for large services, applications, and/or functions, cloud computing may be performed by multiple cloud computing resources in a distributed manner to improve the response time for completion of the service, application, and/or function.

Of the many applications a computer can perform, a database system is one of the largest and most complex applications. In general, a database system stores a large amount of data in a particular way for subsequent processing. In some situations, the hardware of the computer is a limiting factor regarding the speed at which a database system can process a particular function. In some other instances, the way in which the data is stored is a limiting factor regarding the speed of execution. In yet some other instances, restricted co-process options are a limiting factor regarding the speed of execution.

BRIEF DESCRIPTION OF THE SEVERAL VIEWS OF THE DRAWING(S)

FIGS. 15-23 are schematic block diagrams of an example of processing a table or data set for storage in the database system in accordance with the present invention.

DETAILED DESCRIPTION OF THE INVENTION

Figure 1:
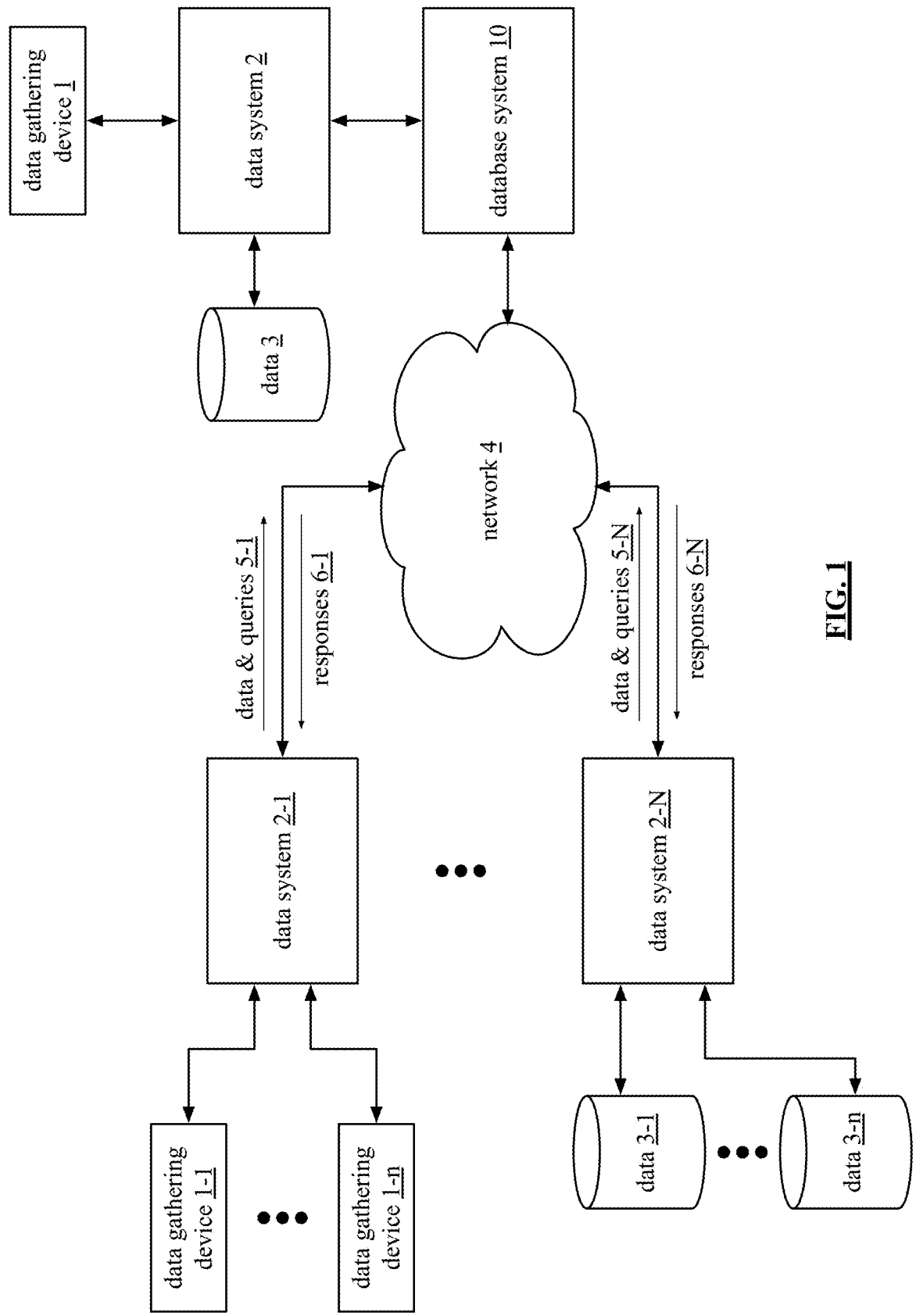
FIG. 1 is a schematic block diagram of an embodiment of a large scale data processing network that includes a database system in accordance with the present invention.

FIG. 1 is a schematic block diagram of an embodiment of a large-scale data processing network that includes data gathering devices (1, 1-1 through 1-n), data systems (2, 2-1 through 2-N), data storage systems (3, 3-1 through 3-n), a network 4, and a database system 10. The data gathering devices are computing devices that collect a wide variety of data and may further include sensors, monitors, measuring instruments, and/or other instrument for collecting data. The data gathering devices collect data in real-time (i.e., as it is happening) and provides it to data system 2-1 for storage and real-time processing of queries 5-1 to produce responses 6-1. As an example, the data gathering devices are computing in a factory collecting data regarding manufacturing of one or more products and the data system is evaluating queries to determine manufacturing efficiency, quality control, and/or product development status.

The data storage systems 3 store existing data. The existing data may originate from the data gathering devices or other sources, but the data is not real time data. For example, the data storage system stores financial data of a bank, a credit card company, or like financial institution. The data system 2-N processes queries 5-N regarding the data stored in the data storage systems to produce responses 6-N.

Data system 2 processes queries regarding real time data from data gathering devices and/or queries regarding non-real time data stored in the data storage system 3. The data system 2 produces responses in regard to the queries. Storage of real time and non-real time data, the processing of queries, and the generating of responses will be discussed with reference to one or more of the subsequent figures.

Figure 1A:
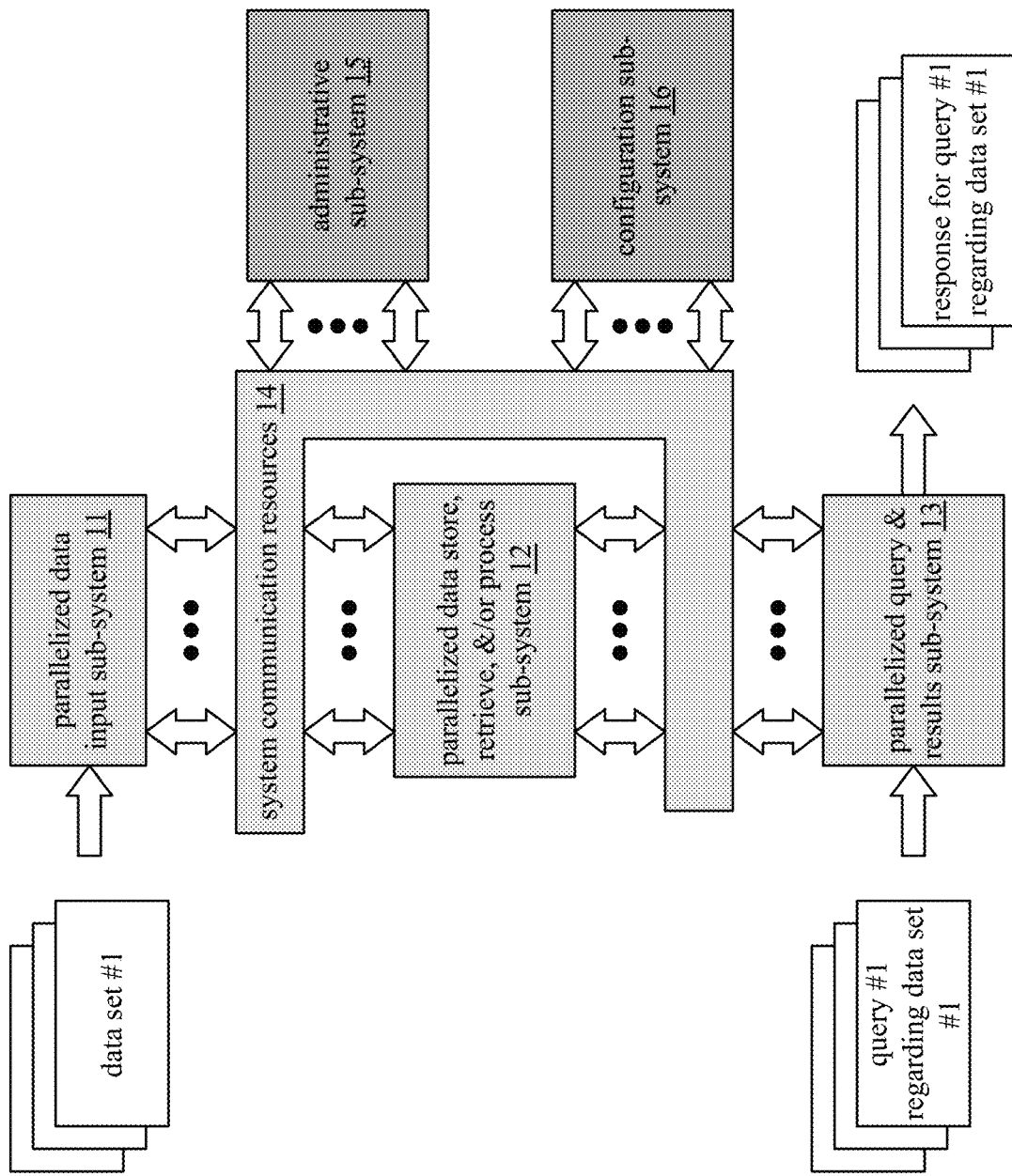
FIG. 1A is a schematic block diagram of an embodiment of a database system in accordance with the present invention.

FIG. 1A is a schematic block diagram of an embodiment of a database system 10 that includes a parallelized data input sub-system 11, a parallelized data store, retrieve, and/or process sub-system 12, a parallelized query and response sub-system 13, system communication resources 14, an administrative sub-system 15, and a configuration sub-system 16. The system communication resources 14 include one or more of wide area network (WAN) connections, local area network (LAN) connections, wireless connections, wireline connections, etc. to couple the sub-systems 11, 12, 13, 15, and 16 together.

Each of the sub-systems 11, 12, 13, 15, and 16 include a plurality of computing devices; an example of which is discussed with reference to one or more of FIGS. 7-9. Hereafter, the parallelized data input sub-system 11 may also be referred to as a data input sub-system, the parallelized data store, retrieve, and/or process sub-system may also be referred to as a data storage and processing sub-system, and the parallelized query and response sub-system 13 may also be referred to as a query and results sub-system.

In an example of operation, the parallelized data input sub-system 11 receives a data set (e.g., a table) that includes a plurality of records. A record includes a plurality of data fields. As a specific example, the data set includes tables of data from a data source. For example, a data source includes one or more computers. As another example, the data source is a plurality of machines. As yet another example, the data source is a plurality of data mining algorithms operating on one or more computers.

As is further discussed with reference to FIG. 15, the data source organizes its records of the data set into a table that includes rows and columns. The columns represent data fields of data for the rows. Each row corresponds to a record of data. For example, a table include payroll information for a company's employees. Each row is an employee's payroll record. The columns include data fields for employee name, address, department, annual salary, tax deduction information, direct deposit information, etc.

The parallelized data input sub-system 11 processes a table to determine how to store it. For example, the parallelized data input sub-system 11 divides the data set into a plurality of data partitions. For each partition, the parallelized data input sub-system 11 divides it into a plurality of data segments based on a segmenting factor. The segmenting factor includes a variety of approaches divide a partition into segments. For example, the segment factor indicates a number of records to include in a segment. As another example, the segmenting factor indicates a number of segments to include in a segment group. As another example, the segmenting factor identifies how to segment a data partition based on storage capabilities of the data store and processing sub-system. As a further example, the segmenting factor indicates how many segments for a data partition based on a redundancy storage encoding scheme.

As an example of dividing a data partition into segments based on a redundancy storage encoding scheme, assume that it includes a 4 of 5 encoding scheme (meaning any 4 of 5 encoded data elements can be used to recover the data). Based on these parameters, the parallelized data input sub-system 11 divides a data partition into 5 segments: one corresponding to each of the data elements).

The parallelized data input sub-system 11 restructures the plurality of data segments to produce restructured data segments. For example, the parallelized data input sub-system 11 restructures records of a first data segment of the plurality of data segments based on a key field of the plurality of data fields to produce a first restructured data segment. The key field is common to the plurality of records. As a specific example, the parallelized data input sub-system 11 restructures a first data segment by dividing the first data segment into a plurality of data slabs (e.g., columns of a segment of a partition of a table). Using one or more of the columns as a key, or keys, the parallelized data input sub-system 11 sorts the data slabs. The restructuring to produce the data slabs is discussed in greater detail with reference to FIG. 4 and FIGS. 16-18.

The parallelized data input sub-system 11 also generates storage instructions regarding how sub-system 12 is to store the restructured data segments for efficient processing of subsequently received queries regarding the stored data. For example, the storage instructions include one or more of: a naming scheme, a request to store, a memory resource requirement, a processing resource requirement, an expected access frequency level, an expected storage duration, a required maximum access latency time, and other requirements associated with storage, processing, and retrieval of data.

A designated computing device of the parallelized data store, retrieve, and/or process sub-system 12 receives the restructured data segments and the storage instructions. The designated computing device (which is randomly selected, selected in a round robin manner, or by default) interprets the storage instructions to identify resources (e.g., itself, its components, other computing devices, and/or components thereof) within the computing device's storage cluster. The designated computing device then divides the restructured data segments of a segment group of a partition of a table into segment divisions based on the identified resources and/or the storage instructions. The designated computing device then sends the segment divisions to the identified resources for storage and subsequent processing in accordance with a query. The operation of the parallelized data store, retrieve, and/or process sub-system 12 is discussed in greater detail with reference to FIG. 6.

The parallelized query and response sub-system 13 receives queries regarding tables (e.g., data sets) and processes the queries prior to sending them to the parallelized data store, retrieve, and/or process sub-system 12 for execution. For example, the parallelized query and response sub-system 13 generates an initial query plan based on a data processing request (e.g., a query) regarding a data set (e.g., the tables). Sub-system 13 optimizes the initial query plan based on one or more of the storage instructions, the engaged resources, and optimization functions to produce an optimized query plan.

For example, the parallelized query and response sub-system 13 receives a specific query no. 1 regarding the data set no. 1 (e.g., a specific table). The query is in a standard query format such as Open Database Connectivity (ODBC), Java Database Connectivity (JDBC), and/or SPARK. The query is assigned to a node within the parallelized query and response sub-system 13 for processing. The assigned node identifies the relevant table, determines where and how it is stored, and determines available nodes within the parallelized data store, retrieve, and/or process sub-system 12 for processing the query.

In addition, the assigned node parses the query to create an abstract syntax tree. As a specific example, the assigned node converts an SQL (Standard Query Language) statement into a database instruction set. The assigned node then validates the abstract syntax tree. If not valid, the assigned node generates a SQL exception, determines an appropriate correction, and repeats. When the abstract syntax tree is validated, the assigned node then creates an annotated abstract syntax tree. The annotated abstract syntax tree includes the verified abstract syntax tree plus annotations regarding column names, data type(s), data aggregation or not, correlation or not, sub-query or not, and so on.

The assigned node then creates an initial query plan from the annotated abstract syntax tree. The assigned node optimizes the initial query plan using a cost analysis function (e.g., processing time, processing resources, etc.) and/or other optimization functions. Having produced the optimized query plan, the parallelized query and response sub-system 13 sends the optimized query plan to the parallelized data store, retrieve, and/or process sub-system 12 for execution. The operation of the parallelized query and response sub-system 13 is discussed in greater detail with reference to FIG. 5.

The parallelized data store, retrieve, and/or process sub-system 12 executes the optimized query plan to produce resultants and sends the resultants to the parallelized query and response sub-system 13. Within the parallelized data store, retrieve, and/or process sub-system 12, a computing device is designated as a primary device for the query plan (e.g., optimized query plan) and receives it. The primary device processes the query plan to identify nodes within the parallelized data store, retrieve, and/or process sub-system 12 for processing the query plan. The primary device then sends appropriate portions of the query plan to the identified nodes for execution. The primary device receives responses from the identified nodes and processes them in accordance with the query plan.

The primary device of the parallelized data store, retrieve, and/or process sub-system 12 provides the resulting response (e.g., resultants) to the assigned node of the parallelized query and response sub-system 13. For example, the assigned node determines whether further processing is needed on the resulting response (e.g., joining, filtering, etc.). If not, the assigned node outputs the resulting response as the response to the query (e.g., a response for query no. 1 regarding data set no. 1). If, however, further processing is determined, the assigned node further processes the resulting response to produce the response to the query. Having received the resultants, the parallelized query and response sub-system 13 creates a response from the resultants for the data processing request.

Figure 2:
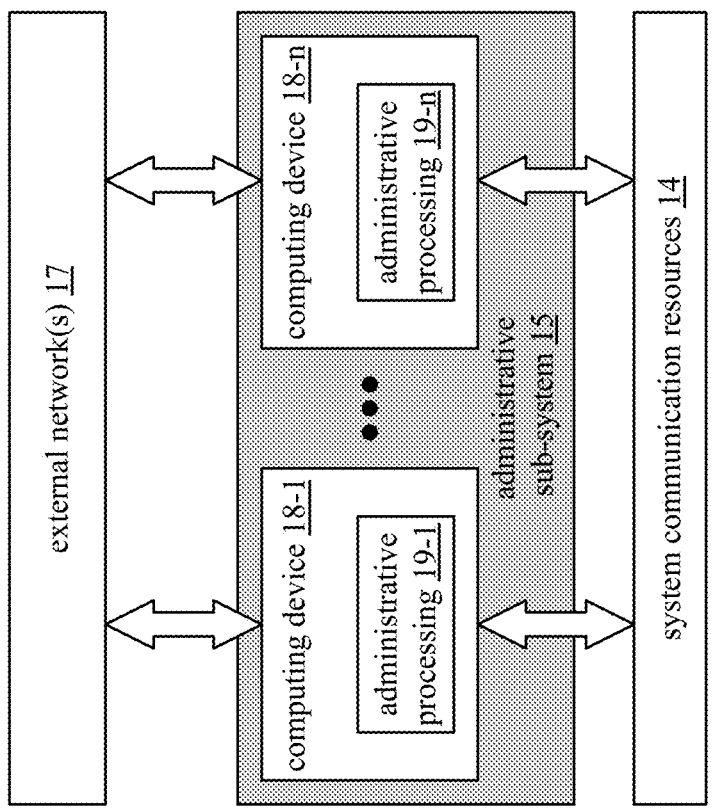
FIG. 2 is a schematic block diagram of an embodiment of an administrative sub-system in accordance with the present invention.

FIG. 2 is a schematic block diagram of an embodiment of the administrative sub-system 15 of FIG. 1A that includes one or more computing devices 18-1 through 18-n. Each of the computing devices executes an administrative processing function utilizing a corresponding administrative processing of administrative processing 19-1 through 19-n (which includes a plurality of administrative operations) that coordinates system level operations of the database system. Each computing device is coupled to an external network 17, or networks, and to the system communication resources 14 of FIG. 1A.

As will be described in greater detail with reference to one or more subsequent figures, a computing device includes a plurality of nodes and each node includes a plurality of processing core resources. Each processing core resource is capable of executing at least a portion of an administrative operation independently. This supports lock free and parallel execution of one or more administrative operations.

The administrative sub-system 15 functions to store metadata of the data set described with reference to FIG. 1A. For example, the storing includes generating the metadata to include one or more of an identifier of a stored table, the size of the stored table (e.g., bytes, number of columns, number of rows, etc.), labels for key fields of data segments, a data type indicator, the data owner, access permissions, available storage resources, storage resource specifications, software for operating the data processing, historical storage information, storage statistics, stored data access statistics (e.g., frequency, time of day, accessing entity identifiers, etc.) and any other information associated with optimizing operation of the database system 10.

Figure 3:
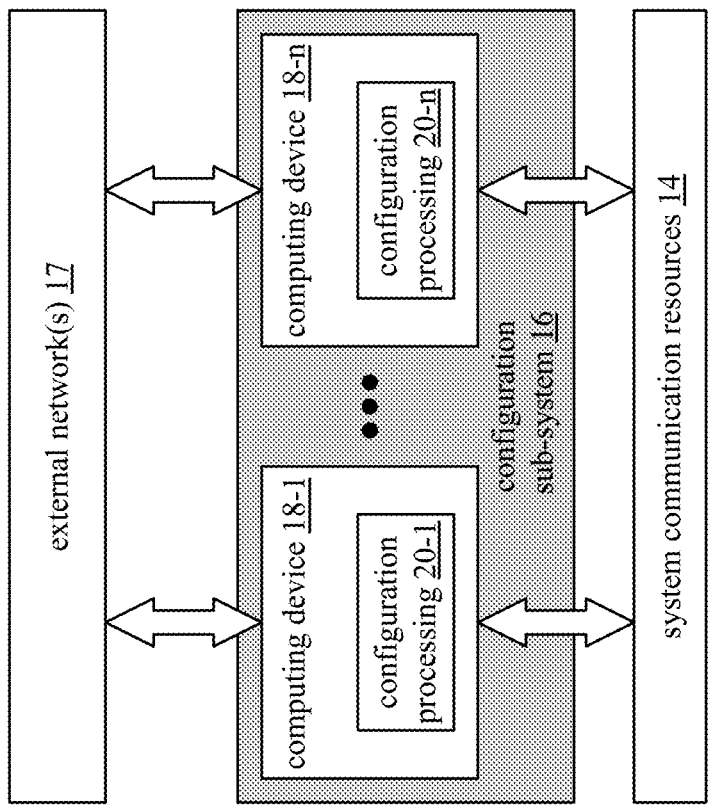
FIG. 3 is a schematic block diagram of an embodiment of a configuration sub-system in accordance with the present invention.

FIG. 3 is a schematic block diagram of an embodiment of the configuration sub-system 16 of FIG. 1A that includes one or more computing devices 18-1 through 18-n. Each of the computing devices executes a configuration processing function 20-1 through 20-n (which includes a plurality of configuration operations) that coordinates system level configurations of the database system. Each computing device is coupled to the external network 17 of FIG. 2, or networks, and to the system communication resources 14 of FIG. 1A.

Figure 4:
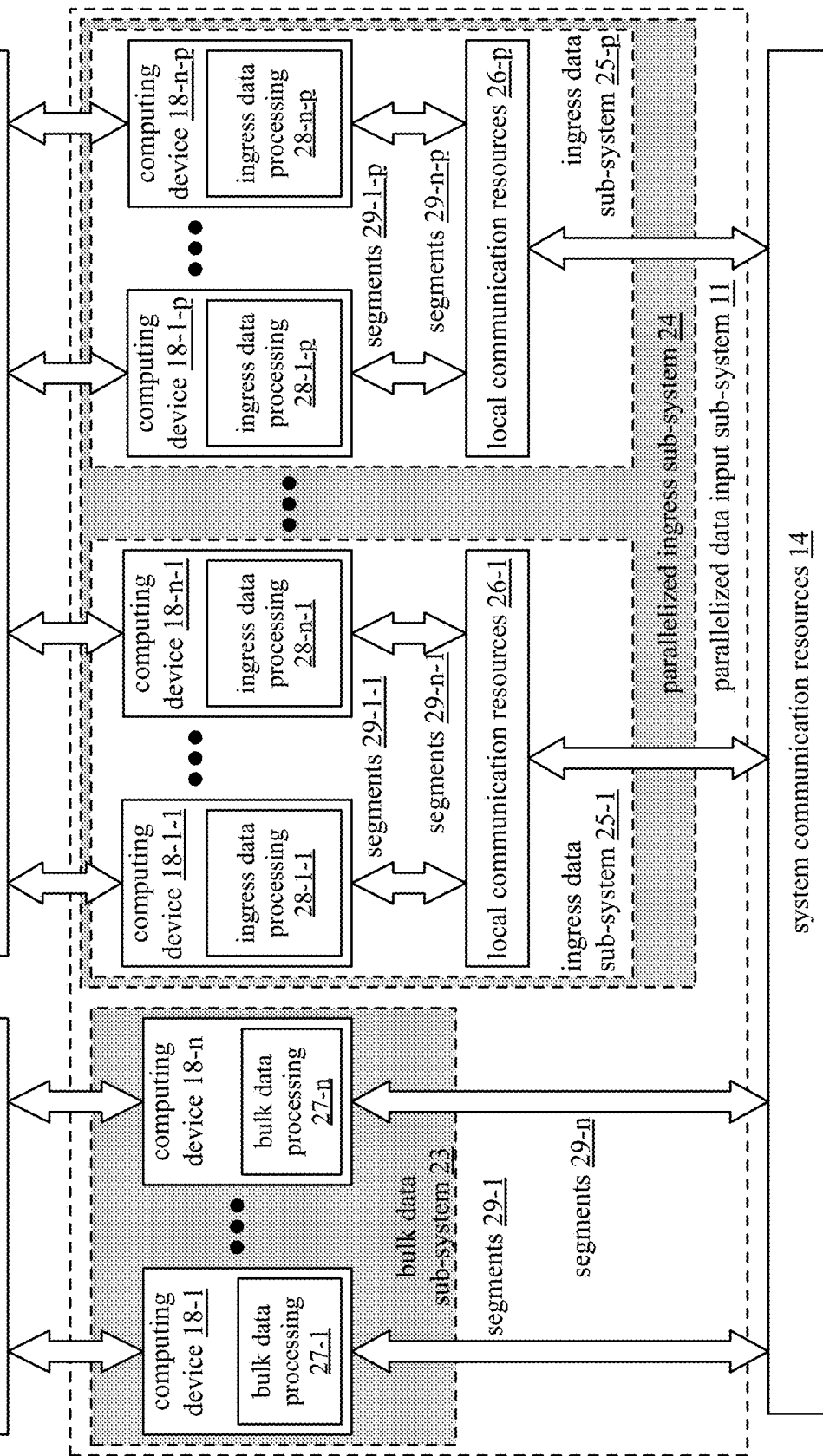
FIG. 4 is a schematic block diagram of an embodiment of a parallelized data input sub-system in accordance with the present invention.

FIG. 4 is a schematic block diagram of an embodiment of the parallelized data input sub-system 11 of FIG. 1A that includes a bulk data sub-system 23 and a parallelized ingress sub-system 24. The bulk data sub-system 23 includes a plurality of computing devices 18-1 through 18-n. A computing device includes a bulk data processing function (e.g., 27-1) for receiving a table from a network storage system 21 (e.g., a server, a cloud storage service, etc.) and processing it for storage as generally discussed with reference to FIG. 1A.

The parallelized ingress sub-system 24 includes a plurality of ingress data sub-systems 25-1 through 25-p that each include a local communication resource of local communication resources 26-1 through 26-p and a plurality of computing devices 18-1 through 18-n. A computing device executes an ingress data processing function (e.g., 28-1) to receive streaming data regarding a table via a wide area network 22 and processing it for storage as generally discussed with reference to FIG. 1A. With a plurality of ingress data sub-systems 25-1 through **25-*p*, data from a plurality of tables can be streamed into the database system 10** at one time.

In general, the bulk data processing function is geared towards receiving data of a table in a bulk fashion (e.g., the table exists and is being retrieved as a whole, or portion thereof). The ingress data processing function is geared towards receiving streaming data from one or more data sources (e.g., receive data of a table as the data is being generated). For example, the ingress data processing function is geared towards receiving data from a plurality of machines in a factory in a periodic or continual manner as the machines create the data.

Figure 5:
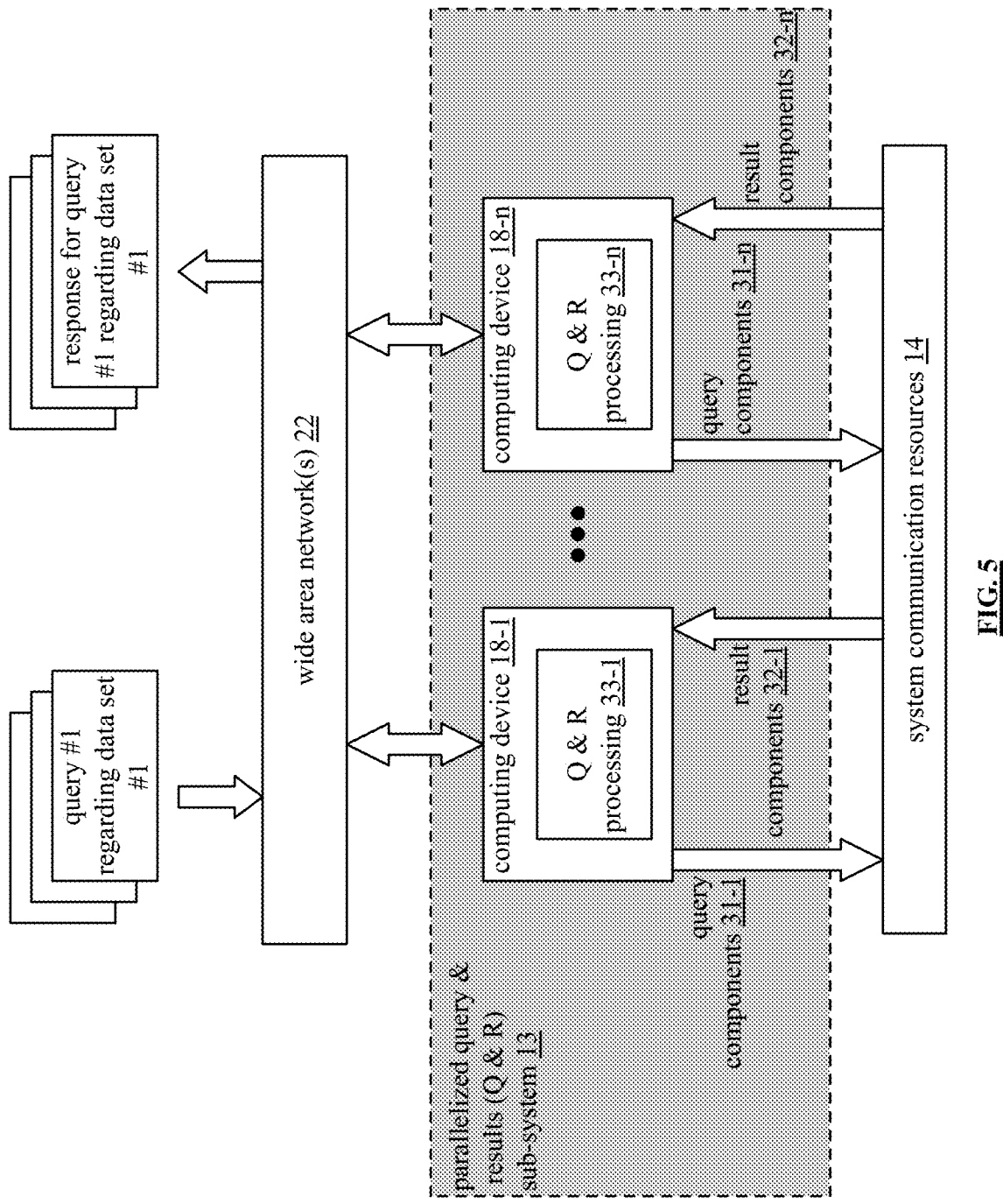
FIG. 5 is a schematic block diagram of an embodiment of a parallelized query and response (Q&R) sub-system in accordance with the present invention.

FIG. 5 is a schematic block diagram of an embodiment of a parallelized query and results sub-system 13 that includes a plurality of computing devices 18-1 through **18-*n*. Each of the computing devices executes a query (Q) & response (R) processing function 33-1 through 33-*n*. The computing devices are coupled to the wide area network 22 to receive queries (e.g., query no. 1 regarding data set no. 1) regarding tables and to provide responses to the queries (e.g., response for query no. 1 regarding the data set no. 1). For example, a computing device (e.g., 18-1) receives a query, creates an initial query plan therefrom, and optimizes it to produce an optimized plan. The computing device then sends components (e.g., one or more operations) of the optimized plan to the parallelized data store, retrieve, &/or process sub-system 12**.

Processing resources of the parallelized data store, retrieve, &/or process sub-system 12 processes the components of the optimized plan to produce results components 32-1 through **32-*n*. The computing device of the Q&R sub-system 13** processes the result components to produce a query response.

The Q&R sub-system 13 allows for multiple queries regarding one or more tables to be processed concurrently. For example, a set of processing core resources of a computing device (e.g., one or more processing core resources) processes a first query and a second set of processing core resources of the computing device (or a different computing device) processes a second query.

As will be described in greater detail with reference to one or more subsequent figures, a computing device includes a plurality of nodes and each node includes multiple processing core resources such that a plurality of computing devices includes pluralities of multiple processing core resources A processing core resource of the pluralities of multiple processing core resources generates the optimized query plan and other processing core resources of the pluralities of multiple processing core resources generates other optimized query plans for other data processing requests. Each processing core resource is capable of executing at least a portion of the Q & R function. In an embodiment, a plurality of processing core resources of one or more nodes executes the Q & R function to produce a response to a query. The processing core resource is discussed in greater detail with reference to FIG. 13.

Figure 6:
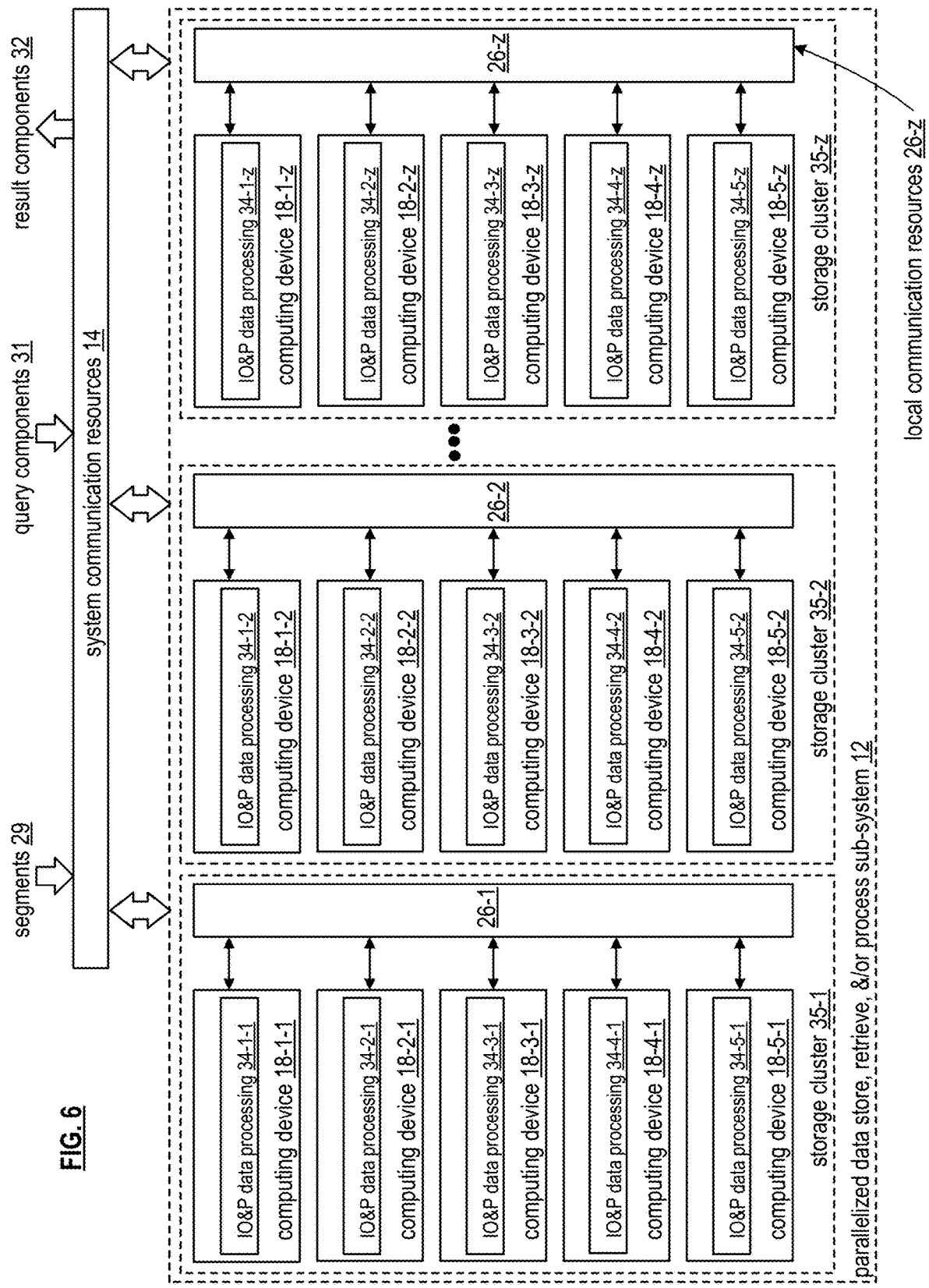
FIG. 6 is a schematic block diagram of an embodiment of a parallelized data store, retrieve, and/or process (IO& P) sub-system in accordance with the present invention.

FIG. 6 is a schematic block diagram of an embodiment of a parallelized data store, retrieve, and/or process sub-system 12 that includes a plurality of computing devices, where each computing device includes a plurality of nodes and each node includes multiple processing core resources. Each processing core resource is capable of executing at least a portion of the function of the parallelized data store, retrieve, and/or process sub-system 12. The plurality of computing devices is arranged into a plurality of storage clusters. Each storage cluster includes a number of computing devices.

In an embodiment, the parallelized data store, retrieve, and/or process sub-system 12 includes a plurality of storage clusters 35-1 through **35-*z*. Each storage cluster includes a corresponding local communication resource 26-1 through 26-*z* and a number of computing devices 18-1 through 18-5. Each computing device executes an input, output, and processing (TO &P) processing function 34-1 through 34-5** to store and process data.

The number of computing devices in a storage cluster corresponds to the number of segments (e.g., a segment group) in which a data partitioned is divided. For example, if a data partition is divided into five segments, a storage cluster includes five computing devices. As another example, if the data is divided into eight segments, then there are eight computing devices in the storage clusters.

To store a segment group of segments 29 within a storage cluster, a designated computing device of the storage cluster interprets storage instructions to identify computing devices (and/or processing core resources thereof) for storing the segments to produce identified engaged resources. The designated computing device is selected by a random selection, a default selection, a round-robin selection, or any other mechanism for selection.

The designated computing device sends a segment to each computing device in the storage cluster, including itself. Each of the computing devices stores their segment of the segment group. As an example, five segments 29 of a segment group are stored by five computing devices of storage cluster 35-1. The first computing device 18-1-1 stores a first segment of the segment group; a second computing device 18-2-1 stores a second segment of the segment group; and so on. With the segments stored, the computing devices are able to process queries (e.g., query components from the Q&R sub-system 13) and produce appropriate result components.

While storage cluster 35-1 is storing and/or processing a segment group, the other storage clusters 35-2 through **35-*n* are storing and/or processing other segment groups. For example, a table is partitioned into three segment groups. Three storage clusters store and/or process the three segment groups independently. As another example, four tables are independently storage and/or processed by one or more storage clusters. As yet another example, storage cluster 35-1** is storing and/or processing a second segment group while it is storing/or and processing a first segment group.

Figure 7:
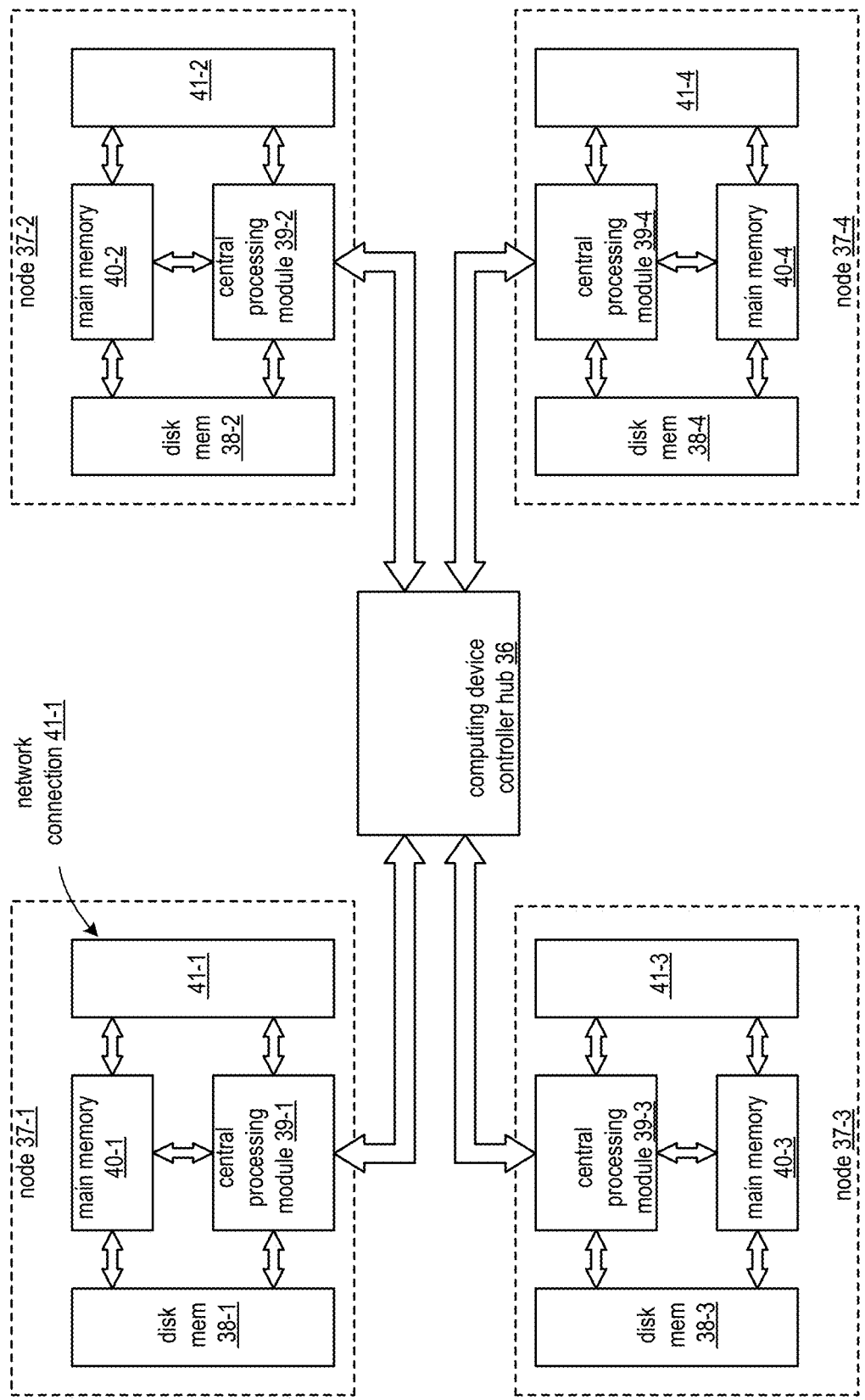
FIG. 7 is a schematic block diagram of an embodiment of a computing device in accordance with the present invention.

FIG. 7 is a schematic block diagram of an embodiment of a computing device 18 that includes a plurality of nodes 37-1 through 37-4 coupled to a computing device controller hub 36. The computing device controller hub 36 includes one or more of a chipset, a quick path interconnect (QPI), and an ultra path interconnection (UPI). Each node 37-1 through 37-4 includes a central processing module 39-1 through 39-4, a main memory 40-1 through 40-4 (e.g., volatile memory), a disk memory 38-1 through 38-4 (non-volatile memory), and a network connection 41-1 through 41-4. In an alternate configuration, the nodes share a network connection, which is coupled to the computing device controller hub 36 or to one of the nodes as illustrated in subsequent figures.

In an embodiment, each node is capable of operating independently of the other nodes. This allows for large scale parallel operation of a query request, which significantly reduces processing time for such queries. In another embodiment, one or more node function as co-processors to share processing requirements of a particular function, or functions.

Figure 8:
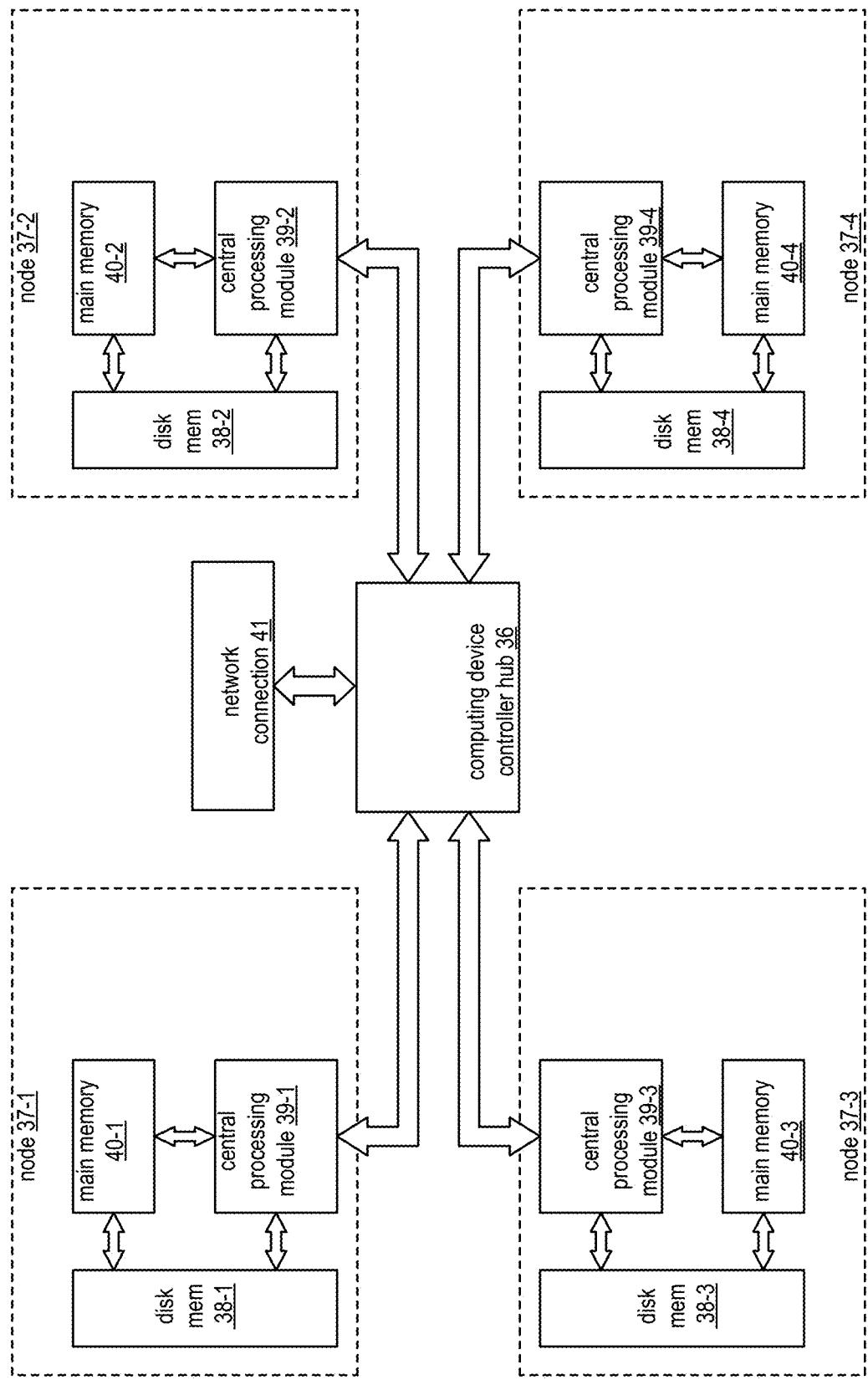
FIG. 8 is a schematic block diagram of another embodiment of a computing device in accordance with the present invention.

FIG. 8 is a schematic block diagram of another embodiment of a computing device is similar to the computing device of FIG. 7 with an exception that it includes a single network connection 41, which is coupled to the computing device controller hub 36. As such, each node coordinates with the computing device controller hub to transmit or receive data via the network connection.

Figure 9:
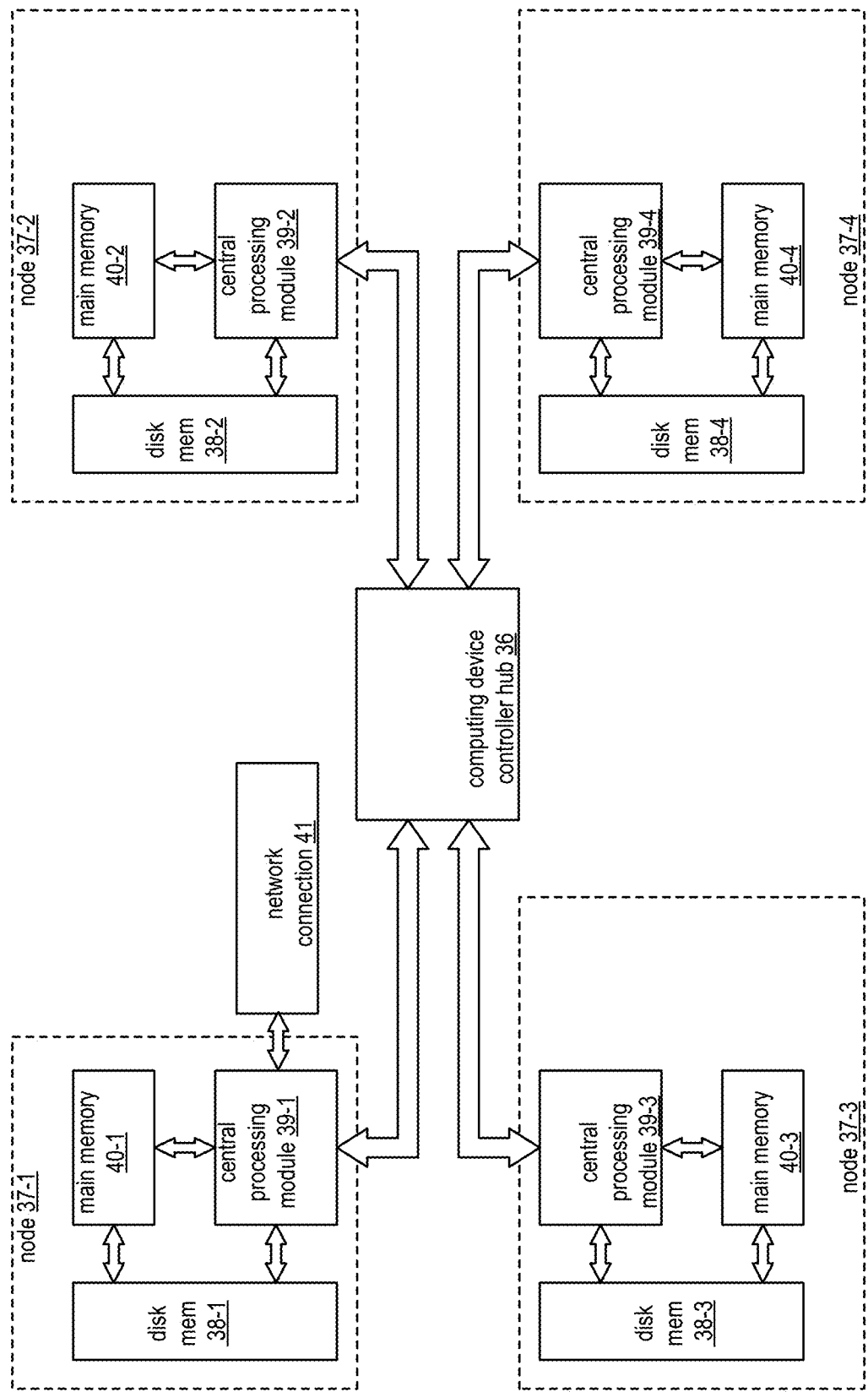
FIG. 9 is a schematic block diagram of another embodiment of a computing device in accordance with the present invention.

FIG. 9 is a schematic block diagram of another embodiment of a computing device is similar to the computing device of FIG. 7 with an exception that it includes a single network connection 41, which is coupled to a central processing module of a node (e.g., to central processing module 39-1 of node 37-1). As such, each node coordinates with the central processing module via the computing device controller hub 36 to transmit or receive data via the network connection.

Figure 10:
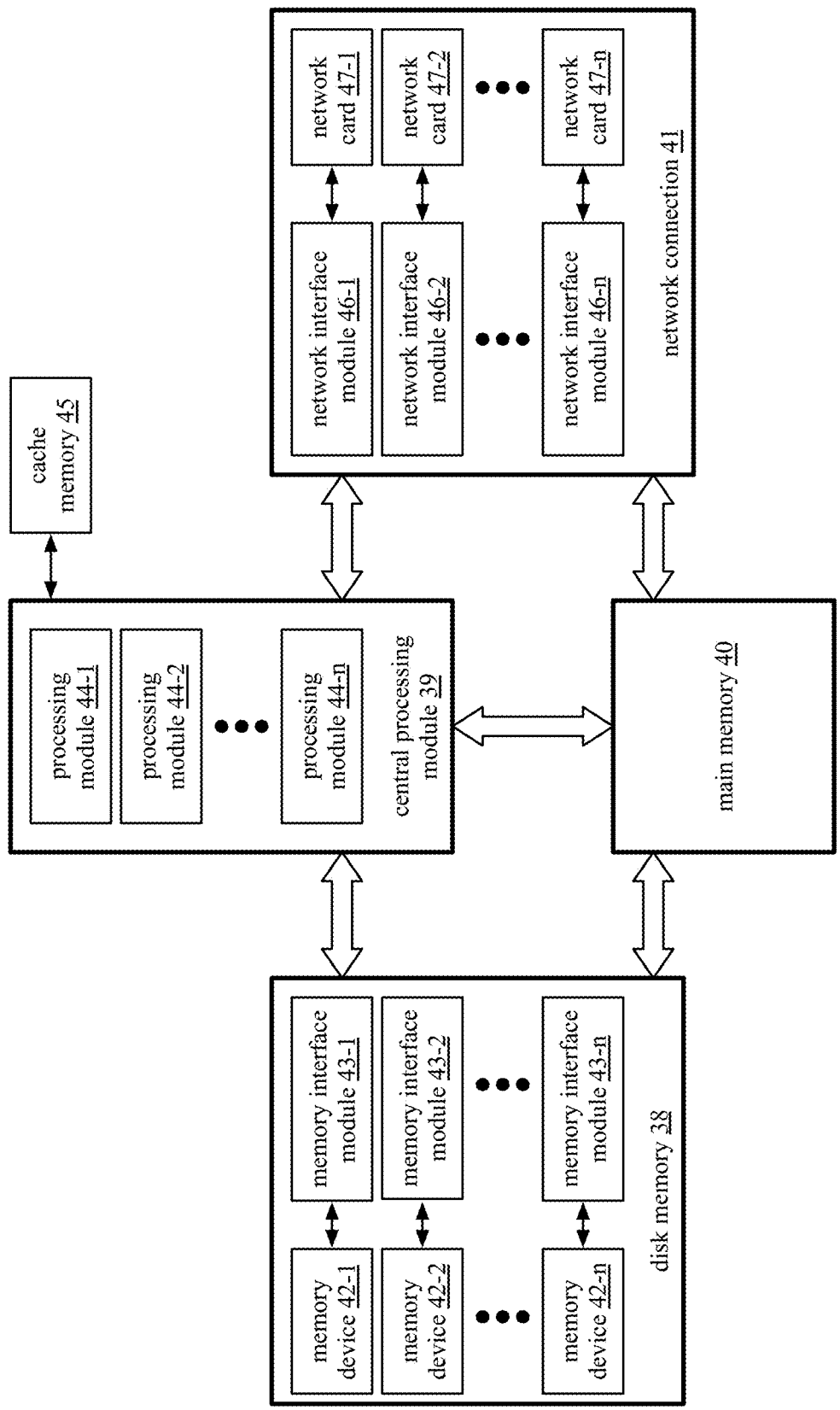
FIG. 10 is a schematic block diagram of an embodiment of a node of a computing device in accordance with the present invention.

FIG. 10 is a schematic block diagram of an embodiment of a node 37 of computing device 18. The node 37 includes the central processing module 39, the main memory 40, the disk memory 38, and the network connection 41. The main memory 40 includes read only memory (RAM) and/or other form of volatile memory for storage of data and/or operational instructions of applications and/or of the operating system. The central processing module 39 includes a plurality of processing modules 44-1 through 44-n and an associated one or more cache memory 45. A processing module is as defined at the end of the detailed description.

The disk memory 38 includes a plurality of memory interface modules 43-1 through 43-n and a plurality of memory devices 42-1 through 42-n (e.g., non-volatile memory). The memory devices 42-1 through 42-n include, but are not limited to, solid state memory, disk drive memory, cloud storage memory, and other non-volatile memory. For each type of memory device, a different memory interface module 43-1 through 43-n is used. For example, solid state memory uses a standard, or serial, ATA (SATA), variation, or extension thereof, as its memory interface. As another example, disk drive memory devices use a small computer system interface (SCSI), variation, or extension thereof, as its memory interface.

In an embodiment, the disk memory 38 includes a plurality of solid state memory devices and corresponding memory interface modules. In another embodiment, the disk memory 38 includes a plurality of solid state memory devices, a plurality of disk memories, and corresponding memory interface modules.

The network connection 41 includes a plurality of network interface modules 46-1 through 46-n and a plurality of network cards 47-1 through 47-n. A network card includes a wireless LAN (WLAN) device (e.g., an IEEE 802.11n or another protocol), a LAN device (e.g., Ethernet), a cellular device (e.g., CDMA), etc. The corresponding network interface modules 46-1 through 46-n include a software driver for the corresponding network card and a physical connection that couples the network card to the central processing module 39 or other component(s) of the node.

The connections between the central processing module 39, the main memory 40, the disk memory 38, and the network connection 41 may be implemented in a variety of ways. For example, the connections are made through a node controller (e.g., a local version of the computing device controller hub 36). As another example, the connections are made through the computing device controller hub 36.

Figure 11:
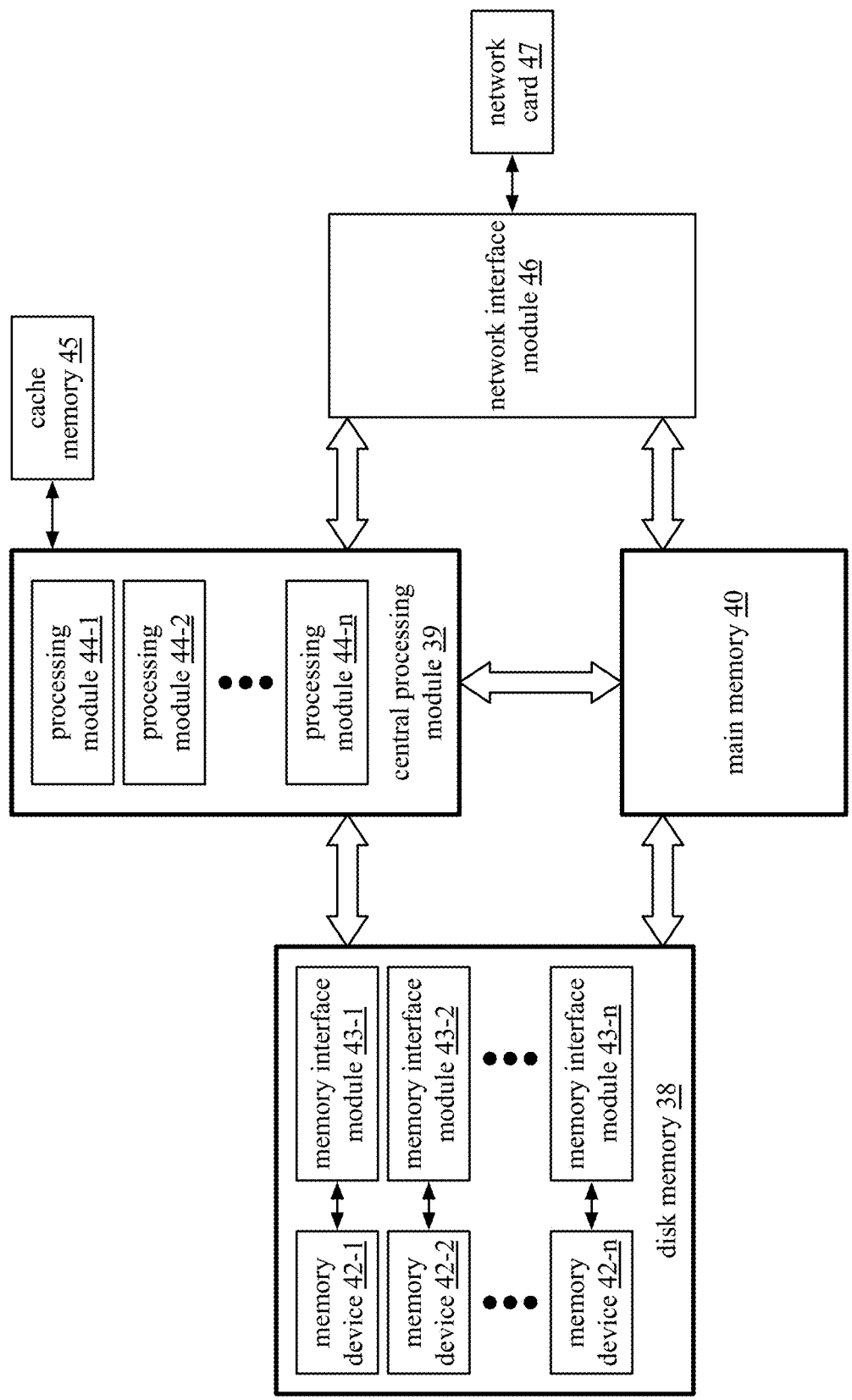
FIG. 11 is a schematic block diagram of an embodiment of a node of a computing device in accordance with the present invention.

FIG. 11 is a schematic block diagram of an embodiment of a node 37 of a computing device 18 that is similar to the node of FIG. 10, with a difference in the network connection. In this embodiment, the node 37 includes a single network interface module 46 and a corresponding network card 47 configuration.

Figure 12:
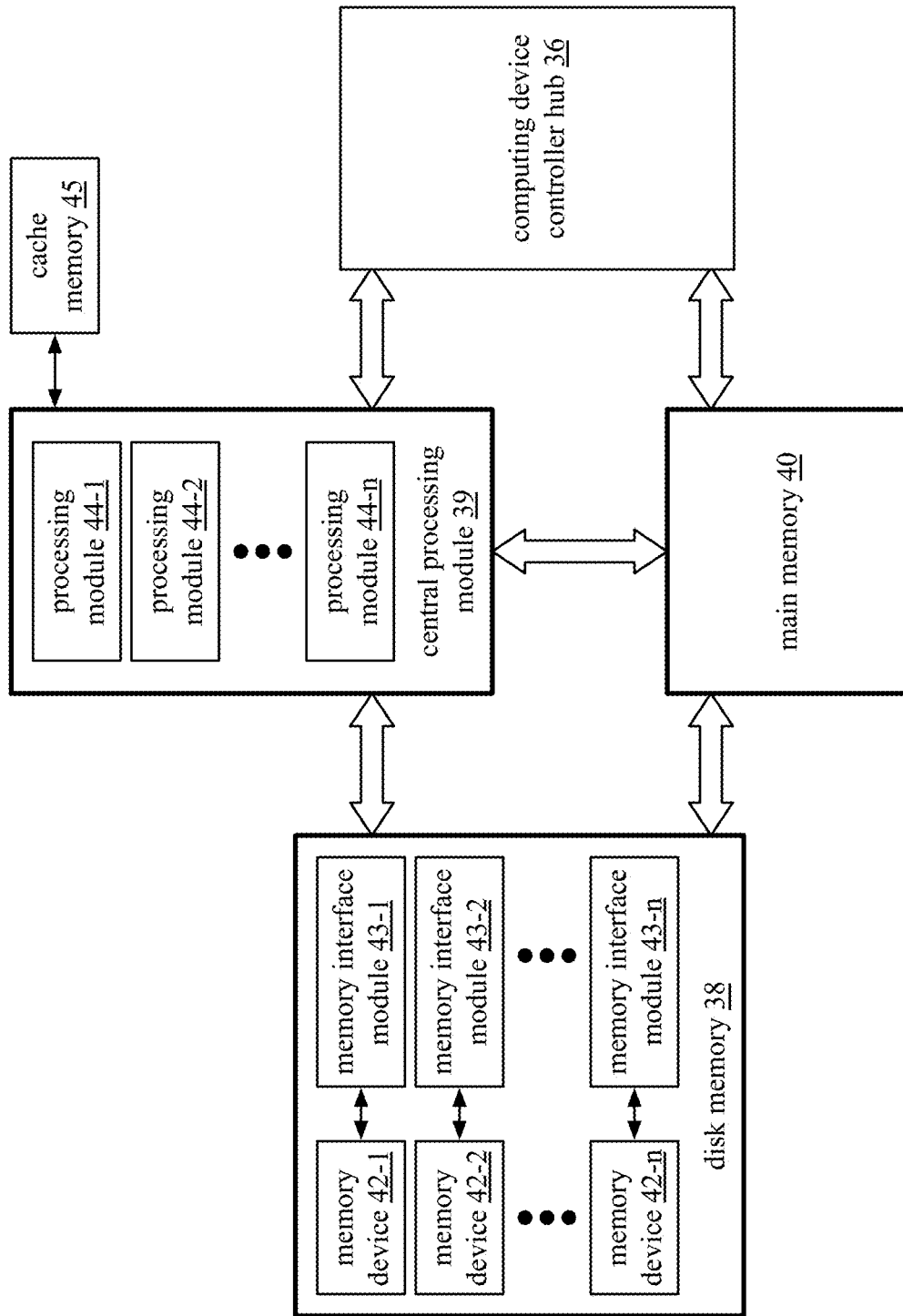
FIG. 12 is a schematic block diagram of an embodiment of a node of a computing device in accordance with the present invention.

FIG. 12 is a schematic block diagram of an embodiment of a node 37 of a computing device 18 that is similar to the node of FIG. 10, with a difference in the network connection. In this embodiment, the node 37 connects to a network connection via the computing device controller hub 36.

Figure 13:
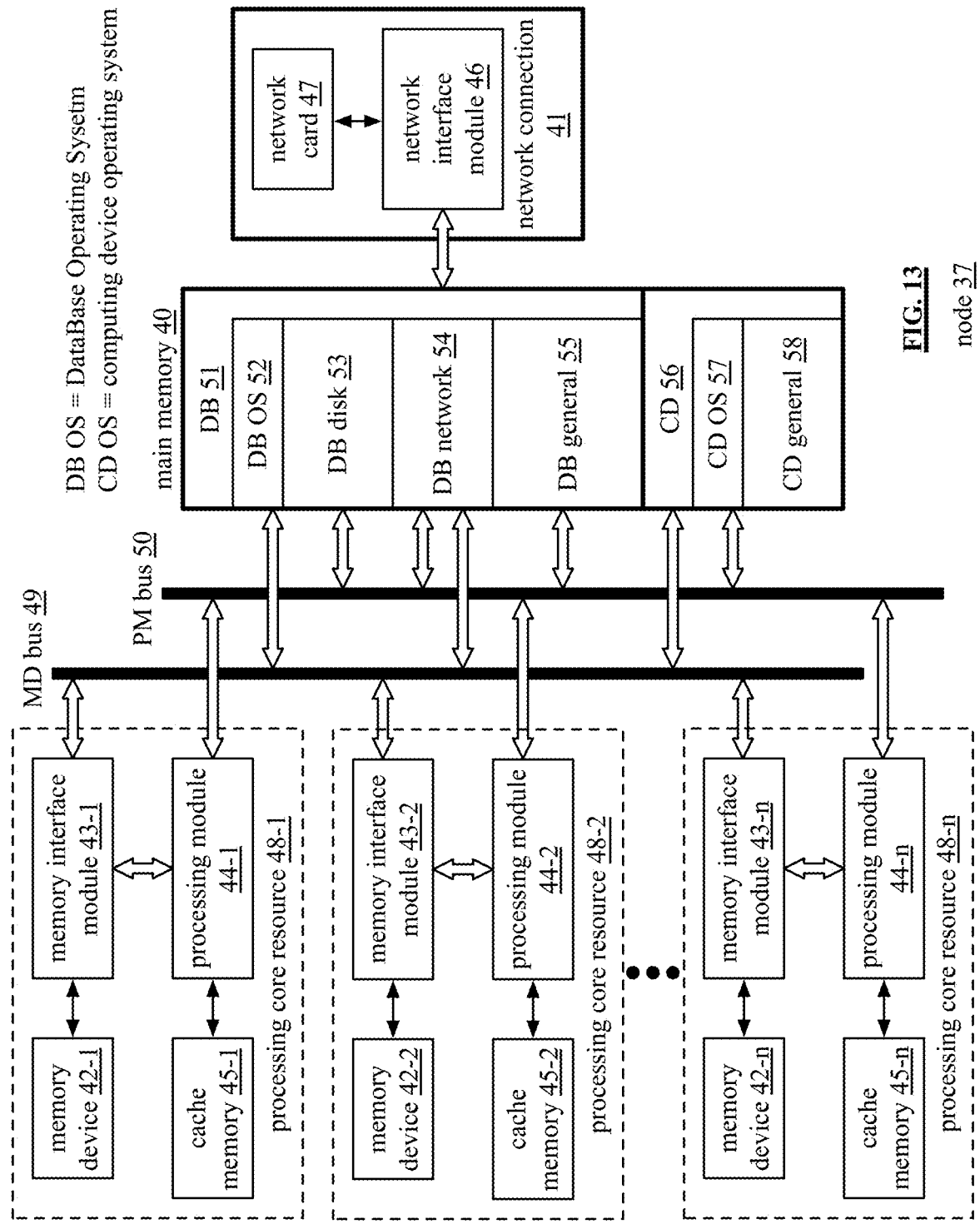
FIG. 13 is a schematic block diagram of an embodiment of a node of a computing device in accordance with the present invention.

FIG. 13 is a schematic block diagram of another embodiment of a node 37 of computing device 18 that includes processing core resources 48-1 through 48-n, a memory device (MD) bus 49, a processing module (PM) bus 50, a main memory 40 and a network connection 41. The network connection 41 includes the network card 47 and the network interface module 46 of FIG. 10. Each processing core resource 48 includes a corresponding processing module 44-1 through 44-n, a corresponding memory interface module 43-1 through 43-n, a corresponding memory device 42-1 through 42-n, and a corresponding cache memory 45-1 through 45-n. In this configuration, each processing core resource can operate independently of the other processing core resources. This further supports increased parallel operation of database functions to further reduce execution time.

The main memory 40 is divided into a computing device (CD) 56 section and a database (DB) 51 section. The database section includes a database operating system (OS) area 52, a disk area 53, a network area 54, and a general area 55. The computing device section includes a computing device operating system (OS) area 57 and a general area 58. Note that each section could include more or less allocated areas for various tasks being executed by the database system.

In general, the database OS 52 allocates main memory for database operations. Once allocated, the computing device OS 57 cannot access that portion of the main memory 40. This supports lock free and independent parallel execution of one or more operations.

Figure 14:
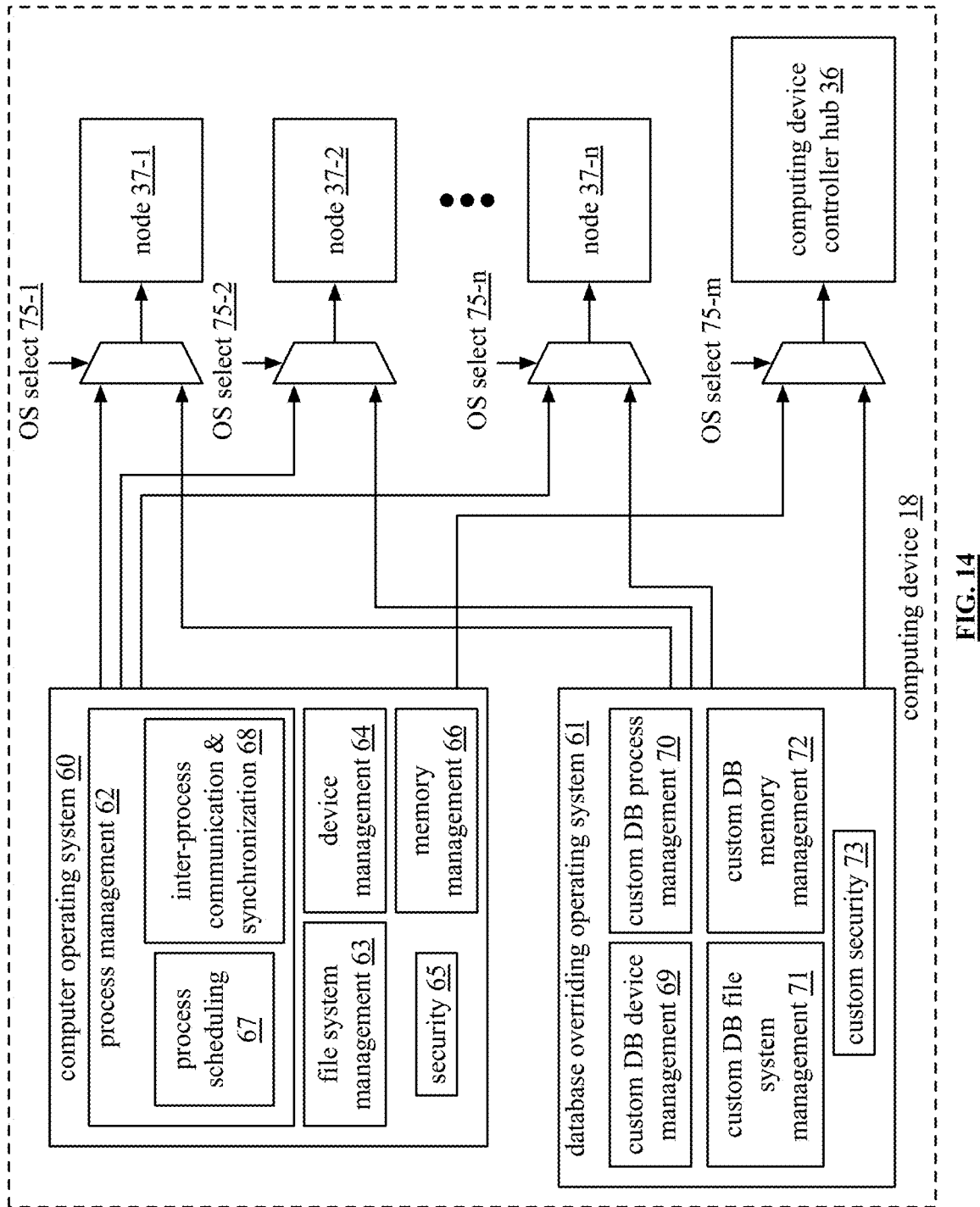
FIG. 14 is a schematic block diagram of an embodiment of operating systems of a computing device in accordance with the present invention.

FIG. 14 is a schematic block diagram of an embodiment of operating systems of a computing device 18. The computing device 18 includes a computer operating system 60 and a database overriding operating system (DB OS) 61. The computer OS 60 includes process management 62, file system management 63, device management 64, memory management 66, and security 65. The processing management 62 generally includes process scheduling 67 and inter-process communication and synchronization 68. In general, the computer OS 60 is a conventional operating system used by a variety of types of computing devices. For example, the computer operating system is a personal computer operating system, a server operating system, a tablet operating system, a cell phone operating system, etc.

The database overriding operating system (DB OS) 61 includes custom DB device management 69, custom DB process management 70 (e.g., process scheduling and/or inter-process communication & synchronization), custom DB file system management 71, custom DB memory management 72, and/or custom security 73. In general, the database overriding OS 61 provides hardware components of a node for more direct access to memory, more direct access to a network connection, improved independency, improved data storage, improved data retrieval, and/or improved data processing than the computing device OS.

In an example of operation, the database overriding OS 61 controls which operating system, or portions thereof, operate with each node and/or computing device controller hub of a computing device (e.g., via OS select 75-1 through 75-n when communicating with nodes 37-1 through 37-*n* and via OS select 75-*m* when communicating with the computing device controller hub 36). For example, device management of a node is supported by the computer operating system, while process management, memory management, and file system management are supported by the database overriding operating system. To override the computer OS, the database overriding OS provides instructions to the computer OS regarding which management tasks will be controlled by the database overriding OS. The database overriding OS also provides notification to the computer OS as to which sections of the main memory it is reserving exclusively for one or more database functions, operations, and/or tasks. One or more examples of the database overriding operating system are provided in subsequent figures.

Figure 15:
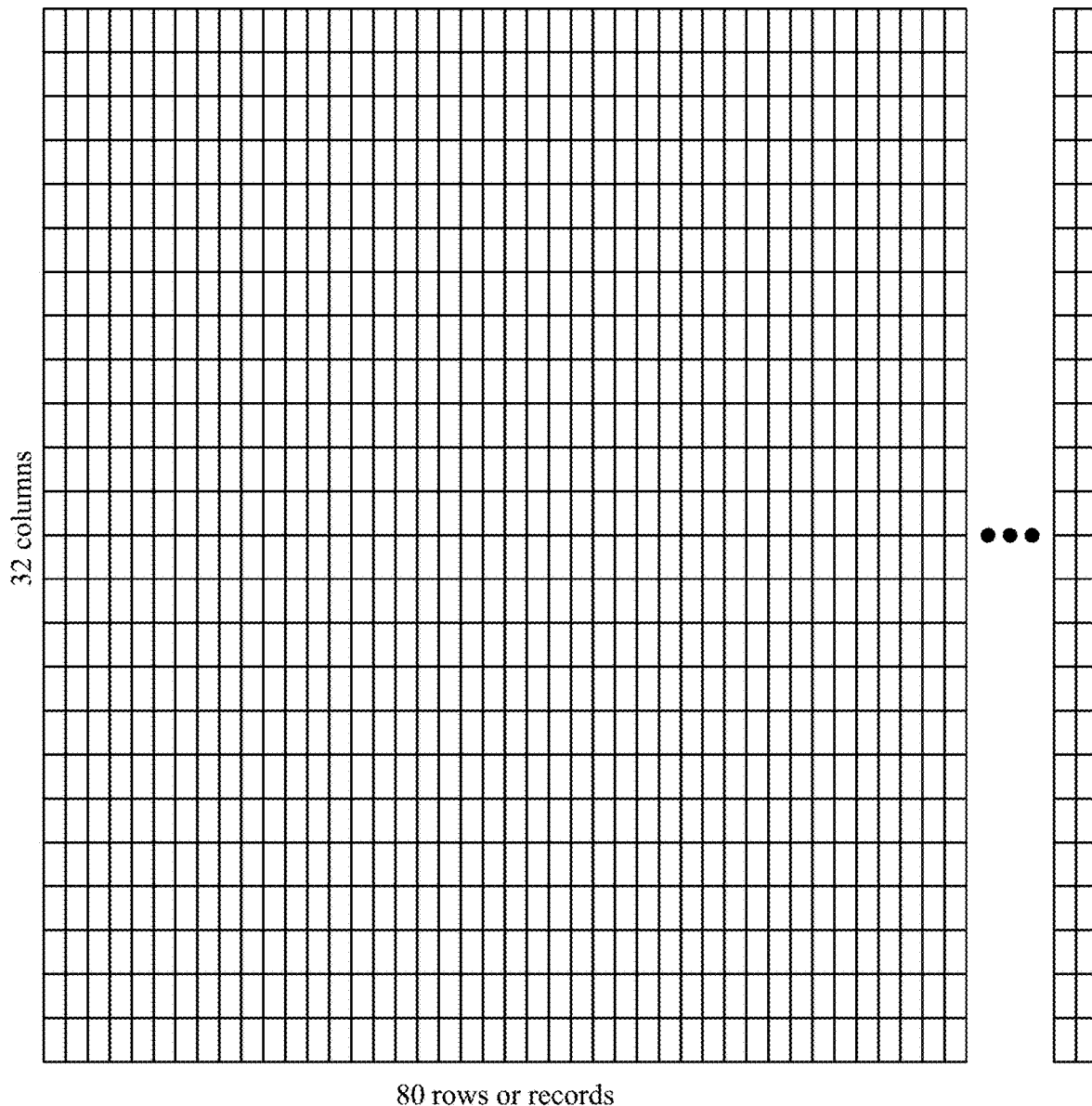

FIGS. 15-23 are schematic block diagrams of an example of processing a table or data set for storage in the database system 10. FIG. 15 illustrates an example of a data set or table that includes 32 columns and 80 rows, or records, that is received by the parallelized data input-subsystem. This is a very small table, but is sufficient for illustrating one or more concepts regarding one or more aspects of a database system. The table is representative of a variety of data ranging from insurance data, to financial data, to employee data, to medical data, and so on.

Figure 16:
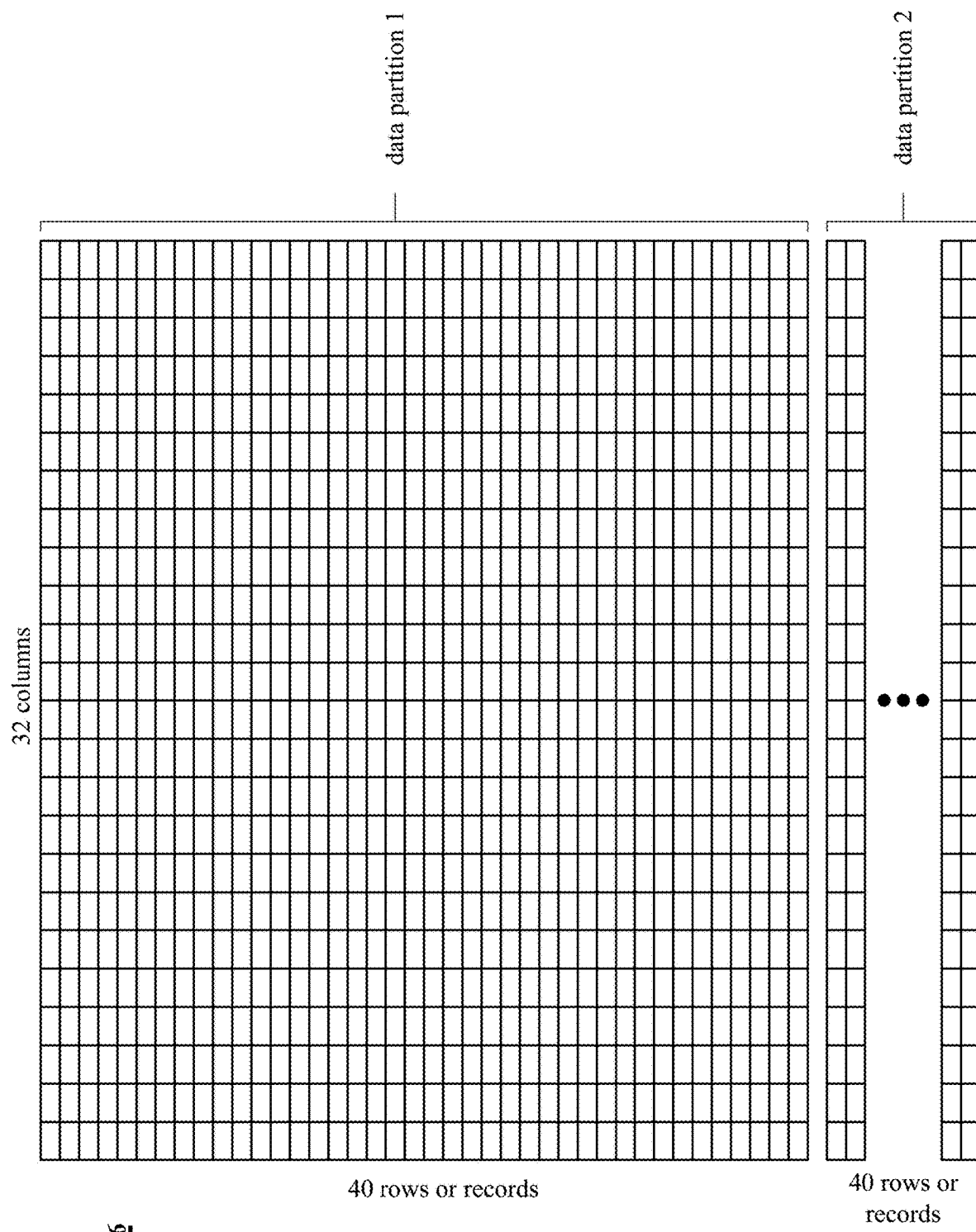

FIG. 16 illustrates an example of the parallelized data input-subsystem dividing the data set into two partitions. Each of the data partitions includes 40 rows, or records, of the data set. In another example, the parallelized data input-subsystem divides the data set into more than two partitions. In yet another example, the parallelized data input-subsystem divides the data set into many partitions and at least two of the partitions have a different number of rows.

FIG. 17 illustrates an example of the parallelized data input-subsystem dividing a data partition into a plurality of segments to form a segment group. The number of segments in a segment group is a function of the data redundancy encoding. In this example, the data redundancy encoding is single parity encoding from four data pieces; thus, five segments are created. In another example, the data redundancy encoding is a two parity encoding from four data pieces; thus, six segments are created. In yet another example, the data redundancy encoding is single parity encoding from seven data pieces; thus, eight segments are created.

FIG. 18 illustrates an example of data for segment 1 of the segments of FIG. 17. The segment is in a raw form since it has not yet been key column sorted. As shown, segment 1 includes 8 rows and 32 columns. The third column is selected as the key column and the other columns stored various pieces of information for a given row (i.e., a record). The key column may be selected in a variety of ways. For example, the key column is selected based on a type of query (e.g., a query regarding a year, where a data column is selected as the key column). As another example, the key column is selected in accordance with a received input command that identified the key column. As yet another example, the key column is selected as a default key column (e.g., a date column, an ID column, etc.)

As an example, the table is regarding a fleet of vehicles. Each row represents data regarding a unique vehicle. The first column stores a vehicle ID, the second column stores make and model information of the vehicle. The third column stores data as to whether the vehicle is on or off. The remaining columns store data regarding the operation of the vehicle such as mileage, gas level, oil level, maintenance information, routes taken, etc.

With the third column selected as the key column, the other columns of the segment are to be sorted based on the key column. Prior to sorted, the columns are separated to form data slabs. As such, one column is separated out to form one data slab.

FIG. 19 illustrates an example of the parallelized data input-subsystem dividing segment 1 of FIG. 18 into a plurality of data slabs. A data slab is a column of segment 1. In this figure, the data of the data slabs has not been sorted. Once the columns have been separated into data slabs, each data slab is sorted based on the key column. Note that more than one key column may be selected and used to sort the data slabs based on two or more other columns.

FIG. 20 illustrates an example of the parallelized data input-subsystem sorting the each of the data slabs based on the key column. In this example, the data slabs are sorted based on the third column which includes data of "on" or "off". The rows of a data slab are rearranged based on the key column to produce a sorted data slab. Each segment of the segment group is divided into similar data slabs and sorted by the same key column to produce sorted data slabs.

Figure 21:
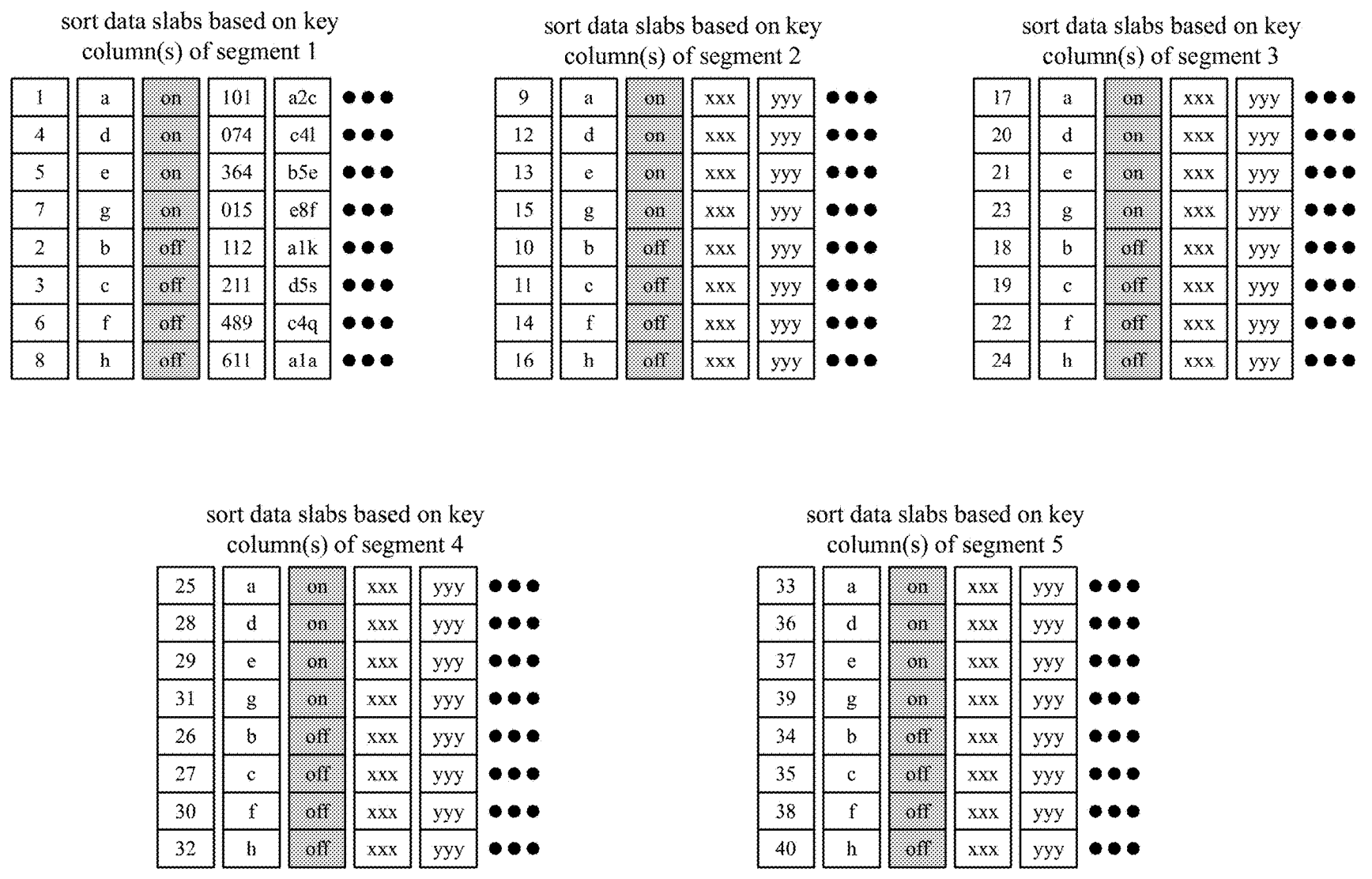

FIG. 21 illustrates an example of each segment of the segment group sorted into sorted data slabs. The similarity of data from segment to segment is for the convenience of illustration. Note that each segment has its own data, which may or may not be similar to the data in the other sections.

Figure 22:
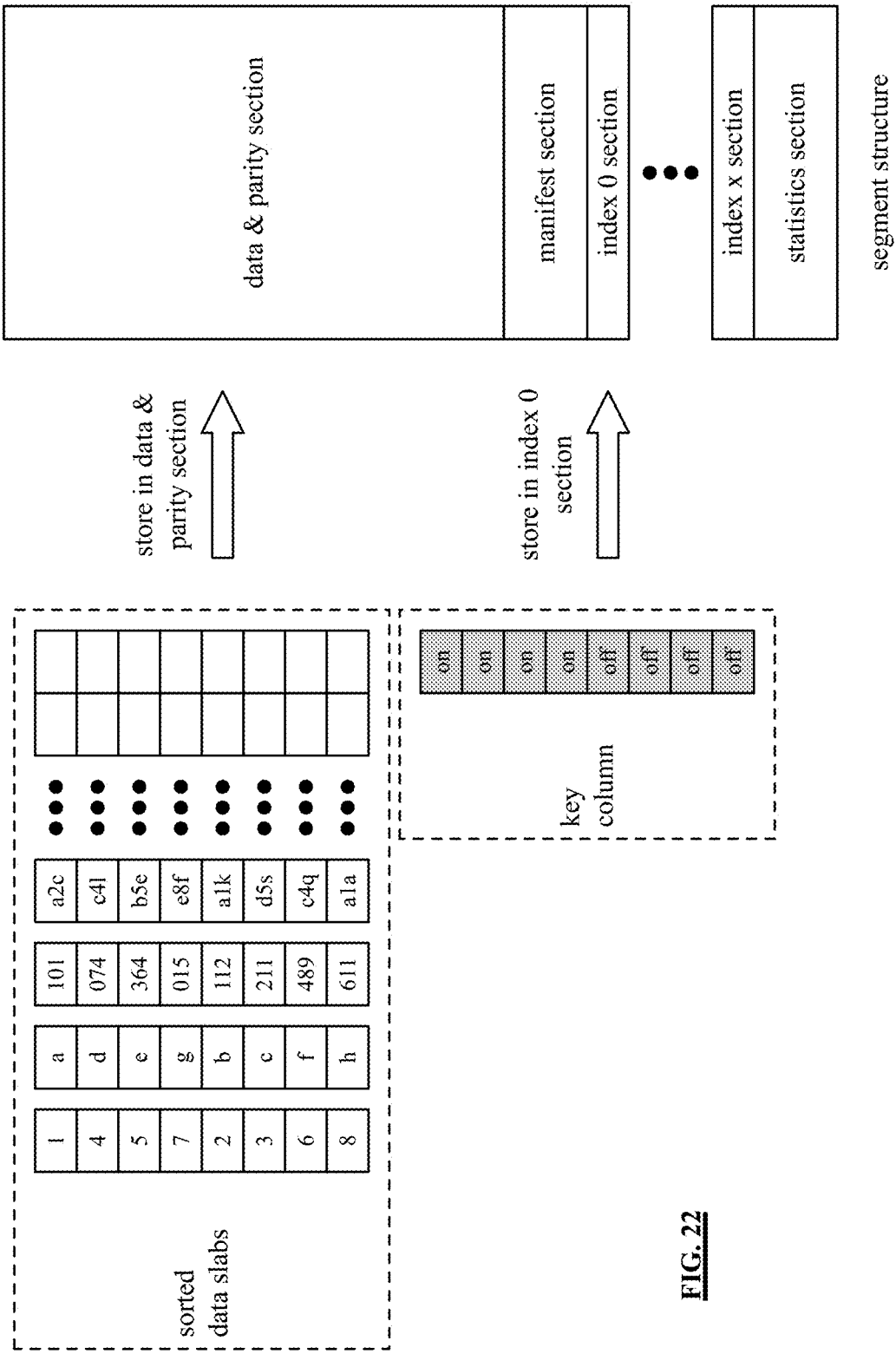

FIG. 22 illustrates an example of a segment structure for a segment of the segment group. The segment structure for a segment includes the data & parity section, a manifest section, one or more index sections, and a statistics section. The segment structure represents a storage mapping of the data (e.g., data slabs and parity data) of a segment and associated data (e.g., metadata, statistics, key column(s), etc.) regarding the data of the segment. The sorted data slabs of FIG. 16 of the segment are stored in the data & parity section of the segment structure. The sorted data slabs are stored in the data & parity section in a compressed format or as raw data (i.e., non-compressed format). Note that a segment structure has a particular data size (e.g., 32 Giga-Bytes) and data is stored within in coding block sizes (e.g., 4 Kilo-Bytes).

Before the sorted data slabs are stored in the data & parity section, or concurrently with storing in the data & parity section, the sorted data slabs of a segment are redundancy encoded. The redundancy encoding may be done in a variety of ways. For example, the redundancy encoding is in accordance with RAID 5, RAID 6, or RAID 10. As another example, the redundancy encoding is a form of forward error encoding (e.g., Reed Solomon, Trellis, etc.).

The manifest section stores metadata regarding the sorted data slabs. The metadata includes one or more of, but is not limited to, descriptive metadata, structural metadata, and/or administrative metadata. Descriptive metadata includes one or more of, but is not limited to, information regarding data such as name, an abstract, keywords, author, etc. Structural metadata includes one or more of, but is not limited to, structural features of the data such as page size, page ordering, formatting, compression information, redundancy encoding information, logical addressing information, physical addressing information, physical to logical addressing information, etc. Administrative metadata includes one or more of, but is not limited to, information that aids in managing data such as file type, access privileges, rights management, preservation of the data, etc.

The key column is stored in an index section. For example, a first key column is stored in index #0. If a second key column exists, it is stored in index #1. As such, for each key column, it is stored in its own index section. Alternatively, one or more key columns are stored in a single index section.

The statistics section stores statistical information regarding the segment and/or the segment group. The statistical information includes one or more of, but is not limited, to number of rows (e.g., data values) in one or more of the sorted data slabs, average length of one or more of the sorted data slabs, average row size (e.g., average size of a data value), etc. The statistical information includes information regarding raw data slabs, raw parity data, and/or compressed data slabs and parity data.

Figure 23:
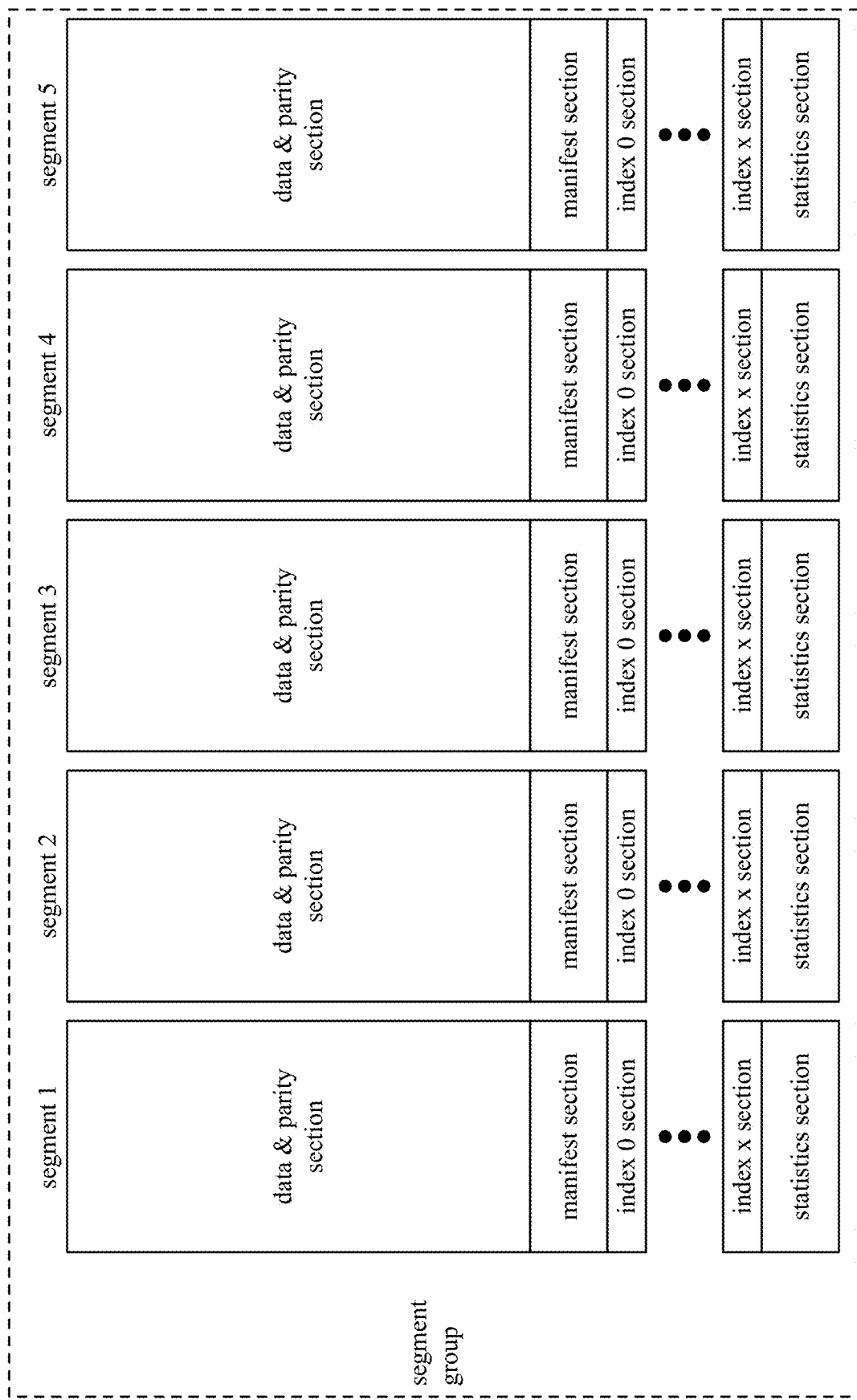

FIG. 23 illustrates the segment structures for each segment of a segment group having five segments. Each segment includes a data & parity section, a manifest section, one or more index sections, and a statistic section. Each segment is targeted for storage in a different computing device of a storage cluster. The number of segments in the segment group corresponds to the number of computing devices in a storage cluster. In this example, there are five computing devices in a storage cluster. Other examples include more or less than five computing devices in a storage cluster.

As may be used herein, the terms "substantially" and "approximately" provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few percent to magnitude differences. As may also be used herein, the term(s) "configured to", "operably coupled to", "coupled to", and/or "coupling" includes direct coupling between items and/or indirect coupling between items via an intervening item (e.g., an item includes, but is not limited to, a component, an element, a circuit, and/or a module) where, for an example of indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to". As may even further be used herein, the term "configured to", "operable to", "coupled to", or "operably coupled to" indicates that an item includes one or more of power connections, input(s), output(s), etc., to perform, when activated, one or more its corresponding functions and may further include inferred coupling to one or more other items. As may still further be used herein, the term "associated with", includes direct and/or indirect coupling of separate items and/or one item being embedded within another item.

As may be used herein, the term "compares favorably", indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1. As may be used herein, the term "compares unfavorably", indicates that a comparison between two or more items, signals, etc., fails to provide the desired relationship.

As may be used herein, one or more claims may include, in a specific form of this generic form, the phrase "at least one of a, b, and c" or of this generic form "at least one of a, b, or c", with more or less elements than "a", "b", and "c". In either phrasing, the phrases are to be interpreted identically. In particular, "at least one of a, b, and c" is equivalent to "at least one of a, b, or c" and shall mean a, b, and/or c. As an example, it means: "a" only, "b" only, "c" only, "a" and "b", "a" and "c", "b" and "c", and/or "a", "b", and "c".

As may also be used herein, the terms "processing module", "processing circuit", "processor", and/or "processing unit" may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module, module, processing circuit, and/or processing unit may be, or further include, memory and/or an integrated memory element, which may be a single memory device, a plurality of memory devices, and/or embedded circuitry of another processing module, module, processing circuit, and/or processing unit. Such a memory device may be a read-only memory, random access memory, volatile memory, non-volatile memory, static memory, dynamic memory, flash memory, cache memory, and/or any device that stores digital information. Note that if the processing module, module, processing circuit, and/or processing unit includes more than one processing device, the processing devices may be centrally located (e.g., directly coupled together via a wired and/or wireless bus structure) or may be distributedly located (e.g., cloud computing via indirect coupling via a local area network and/or a wide area network). Further note that if the processing module, module, processing circuit, and/or processing unit implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element may store, and the processing module, module, processing circuit, and/or processing unit executes, hard coded and/or operational instructions corresponding to at least some of the steps and/or functions illustrated in one or more of the Figures. Such a memory device or memory element can be included in an article of manufacture.

One or more embodiments have been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claims. Further, the boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality.

To the extent used, the flow diagram block boundaries and sequence could have been defined otherwise and still perform the certain significant functionality. Such alternate definitions of both functional building blocks and flow diagram blocks and sequences are thus within the scope and spirit of the claims. One of average skill in the art will also recognize that the functional building blocks, and other illustrative blocks, modules and components herein, can be implemented as illustrated or by discrete components, application specific integrated circuits, processors executing appropriate software and the like or any combination thereof.

In addition, a flow diagram may include a "start" and/or "continue" indication. The "start" and "continue" indications reflect that the steps presented can optionally be incorporated in or otherwise used in conjunction with other routines. In this context, "start" indicates the beginning of the first step presented and may be preceded by other activities not specifically shown. Further, the "continue" indication reflects that the steps presented may be performed multiple times and/or may be succeeded by other activities not specifically shown. Further, while a flow diagram indicates a particular ordering of steps, other orderings are likewise possible provided that the principles of causality are maintained.

The one or more embodiments are used herein to illustrate one or more aspects, one or more features, one or more concepts, and/or one or more examples. A physical embodiment of an apparatus, an article of manufacture, a machine, and/or of a process may include one or more of the aspects, features, concepts, examples, etc. described with reference to one or more of the embodiments discussed herein. Further, from figure to figure, the embodiments may incorporate the same or similarly named functions, steps, modules, etc. that may use the same or different reference numbers and, as such, the functions, steps, modules, etc. may be the same or similar functions, steps, modules, etc. or different ones.

Unless specifically stated to the contra, signals to, from, and/or between elements in a figure of any of the figures presented herein may be analog or digital, continuous time or discrete time, and single-ended or differential. For instance, if a signal path is shown as a single-ended path, it also represents a differential signal path. Similarly, if a signal path is shown as a differential path, it also represents a single-ended signal path. While one or more particular architectures are described herein, other architectures can likewise be implemented that use one or more data buses not expressly shown, direct connectivity between elements, and/or indirect coupling between other elements as recognized by one of average skill in the art.

The term "module" is used in the description of one or more of the embodiments. A module implements one or more functions via a device such as a processor or other processing device or other hardware that may include or operate in association with a memory that stores operational instructions. A module may operate independently and/or in conjunction with software and/or firmware. As also used herein, a module may contain one or more sub-modules, each of which may be one or more modules.

As may further be used herein, a computer readable memory includes one or more memory elements. A memory element may be a separate memory device, multiple memory devices, a set of memory locations within a memory device or a memory section. Such a memory device may be a read-only memory, random access memory, volatile memory, non-volatile memory, static memory, dynamic memory, flash memory, cache memory, and/or any device that stores digital information. The memory device may be in a form a solid-state memory, a hard drive memory, cloud memory, thumb drive, server memory, computing device memory, and/or other physical medium for storing digital information.

While particular combinations of various functions and features of the one or more embodiments have been expressly described herein, other combinations of these features and functions are likewise possible. The present disclosure is not limited by the particular examples disclosed herein and expressly incorporates these other combinations.

What is claimed is:

1. A computing system comprises:
   a plurality of computing devices, wherein each computing device of the plurality of computing devices comprises:
      a plurality of parallelized nodes, wherein each node of the plurality of parallelized nodes comprises:
         a main memory comprising:
            a computing device section that includes a computing device operating system area and a computing device general area; and
            a database section that includes a database operating system area, a disk area, a network area, and a database general area;
            wherein the database operating system area allocates at least one portion of the main memory for database operations, and wherein the at least one portion of the main memory is locked from access by the computing device operating system area;
         and
         a plurality of processing core resources;
   wherein the plurality of computing devices is operable to collectively execute query requests against at least one database table stored by the plurality of computing devices based on the each node of the plurality of parallelized nodes of the each computing device performing corresponding operations independently from other nodes of the plurality of parallelized nodes.

2. The computing system of claim 1, wherein the plurality of processing core resources of the each node is operable to collectively perform the corresponding operations of the each node, and wherein each processing core resource of the plurality of processing core resources of the each node is operable to perform operations independently from other ones of the plurality of processing core resources of the node.

3. The computing system of claim 1, wherein a subset of the plurality of parallelized nodes are further configured to function as co-processors based on sharing processing requirements of a single function.

4. The computing system of claim 1, wherein the plurality of computing devices include a plurality of sets of computing devices, and wherein each set of computing devices of the plurality of sets of computing devices corresponds to one of a plurality of storage clusters.

5. The computing system of claim 1, further comprising:
   a shared network connection coupled to a central processing module of only a single node of the plurality of parallelized nodes, wherein each node coordinates with the central processing module of the single node to communicate data via the shared network connection.

6. A node comprises:
   a main memory comprising:
      a computing device section that includes a computing device operating system area and a computing device general area; and a database section that includes a database operating system area, a disk area, a network area, and a database general area;

wherein the database operating system area allocates at least one portion of the main memory for database operations, and wherein the at least one portion of the main memory is locked from access by the computing device operating system area; and a plurality of processing core resources;

wherein the node is operable to perform corresponding operations in conjunction with execution of query requests against at least one database table based on the plurality of processing core resources of the node being operable to collectively perform the corresponding operations, and wherein each processing core resource of the plurality of processing core resources of the node is operable to perform operations independently from other ones of the plurality of processing core resources of the node.

7. The node of claim 6, wherein the node is operable to concurrently process multiple queries based on: a first set of processing core resources of the plurality of processing core resources processing a first query within a given temporal period, and a second set of processing core resources of the plurality of processing core resources processing a second query within the given temporal period.

8. The node of claim 7, wherein a first processing core resource of the plurality of processing core resources generates a first optimized query plan for execution of the first query, and wherein a second processing core resource of the plurality of processing core resources generates a second optimized query plan for execution of the second query.

9. The node of claim 6, wherein the node communicates with a computing device controller hub that includes at least one of: a chipset, a quick path interconnect (QPI), or an ultra path interconnection (UPI).

10. The node of claim 6, wherein the node further comprises a network connection that includes at least one network interface module and at least one corresponding network card, and wherein the node communicates data via the network connection.

11. The node of claim 10, wherein the at least one corresponding network card includes at least one of: a wireless LAN device, a LAN device, or a cellular device; and wherein the at least one network interface module includes at least one software driver the at least one corresponding network card.

12. The node of claim 6, wherein the node further comprises:

a central processing module that includes the plurality of processing modules of the node and a plurality of cache memories of the node; and a disk memory that includes a plurality of memory interface modules of the node and a plurality of memory devices of the node.

13. The node of claim 6, wherein a plurality of memory devices of the node includes at least one of: a plurality of disk memories, or a plurality of solid state memories.

14. The node of claim 6, wherein the node is one of a plurality of parallelized nodes operable to collectively execute query requests, and wherein the node performs the corresponding operations via the plurality of processing core resources independently from other nodes of the plurality of parallelized nodes.

15. The node of claim 14, wherein the node is one of a subset of the plurality of parallelized nodes based on the node being configured to function as one of a plurality of co-processors based the subset of the plurality of nodes sharing processing requirements of a single function.

16. The node of claim 14, wherein the node is implemented on a computing device, wherein the computing device is one of a plurality of computing devices of a computing system, and wherein the computing device executes the query requests against the at least one database table based on each node of the plurality of parallelized nodes of the each computing device performing corresponding operations independently from the other nodes of the plurality of parallelized nodes.

17. The node of claim 16, wherein the plurality of computing devices include a plurality of sets of computing devices, and wherein each set of computing devices of the plurality of sets of computing devices corresponds to one of a plurality of storage clusters, and wherein the node corresponds to a first one of the plurality of storage clusters based on the computing device belonging to the one of the plurality of storage clusters.

18. The node of claim 14, wherein the node further comprises a shared network connection coupled to a central processing module of the node, wherein each of the other nodes coordinates with the central processing module of the node to communicate data via the shared network connection.

19. A computing device comprises:

a plurality of parallelized nodes, wherein each node of the plurality of parallelized nodes comprises:

a main memory comprising:

a computing device section that includes a computing device operating system area and a computing device general area; and a database section that includes a database operating system area, a disk area, a network area, and a database general area;

wherein the database operating system area allocates at least one portion of the main memory for database operations, and wherein the at least one portion of the main memory is locked from access by the computing device operating system area; and a plurality of processing core resources;

wherein the plurality of parallelized nodes is operable to collectively execute query requests based on each node of the plurality of parallelized nodes performing corresponding operations independently from other nodes of the plurality of parallelized nodes.

20. The computing device of claim 19, wherein the plurality of processing core resources of the each node is operable to collectively perform the corresponding operations of the each node, and wherein each processing core resource of the each node is operable to perform operations independently from other ones of the plurality of processing core resources of the each node.

* * * * *